(12) United States Patent
Kim et al.

(10) Patent No.: US 11,662,836 B2
(45) Date of Patent: May 30, 2023

(54) ELECTRONIC DEVICE HAVING AN IMPROVED SENSING SENSITIVITY AND INTERFACE SYSTEM INCLUDING THE SAME

(71) Applicant: Samsung Display Co., Ltd., Yongin-Si (KR)

(72) Inventors: Chul Kim, Hwaseong-si (KR); Yun-Ho Kim, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/544,280

(22) Filed: Dec. 7, 2021

(65) Prior Publication Data

US 2022/0350426 A1    Nov. 3, 2022

(30) Foreign Application Priority Data

Apr. 29, 2021 (KR) .................. 10-2021-0055884

(51) Int. Cl.
  *G06F 3/0354* (2013.01)
  *G06F 3/044* (2006.01)
  *H01L 27/32* (2006.01)

(52) U.S. Cl.
  CPC ........ *G06F 3/03545* (2013.01); *G06F 3/0445* (2019.05); *H01L 27/323* (2013.01); *H01L 27/3244* (2013.01)

(58) Field of Classification Search
  CPC .................... G06F 3/03545; G06F 3/0445
  See application file for complete search history.

(56) References Cited

U.S. PATENT DOCUMENTS

| | | |
|---|---|---|
| 9,158,398 B2 | 10/2015 | Jeong et al. |
| 10,054,466 B2 | 8/2018 | Matsumoto |
| 2015/0123940 A1 | 5/2015 | Park et al. |
| 2017/0115792 A1* | 4/2017 | Nishimura .............. G06F 3/044 |
| 2019/0204962 A1 | 7/2019 | Lee et al. |
| 2019/0227692 A1* | 7/2019 | Kim ...................... G06F 3/0445 |
| 2020/0064973 A1* | 2/2020 | Mitsui ..................... B32B 23/08 |
| 2021/0034180 A1 | 2/2021 | Hirotsugu et al. |
| 2021/0132724 A1* | 5/2021 | Kwon ................... H01L 27/323 |

FOREIGN PATENT DOCUMENTS

| | | |
|---|---|---|
| EP | 2533139 A2 | 12/2012 |
| EP | 3771974 A1 | 2/2021 |
| KR | 10-1391243 B1 | 5/2014 |
| KR | 10-2021-0016258 A | 2/2021 |

* cited by examiner

*Primary Examiner* — Chun-Nan Lin
(74) *Attorney, Agent, or Firm* — Innovation Counsel LLP

(57) ABSTRACT

An electronic device includes a display layer, a sensor layer disposed on the display layer, and a lower member that is disposed under the display layer and includes a first shielding layer. The sensor layer operates in a first touch mode for sensing a first input based on a capacitance change and a second touch mode for sensing a second input of an input device that is configured to emit a magnetic field, and the first shielding layer shields the magnetic field that is transmitted through the sensor layer.

20 Claims, 20 Drawing Sheets

ELECTRONIC DEVICE HAVING AN IMPROVED SENSING SENSITIVITY AND INTERFACE SYSTEM INCLUDING THE SAME

CROSS-REFERENCE TO RELATED APPLICATIONS

This application claims priority under 35 U.S.C. § 119 to Korean Patent Application No. 10-2021-0055884 filed on Apr. 29, 2021, in the Korean Intellectual Property Office, the disclosure of which is incorporated by reference herein in its entirety.

BACKGROUND

The present disclosure described herein relates to an electronic device having an improved sensing sensitivity and an interface system including the same.

Multimedia electronic devices, such as televisions, mobile phones, tablet computers, navigation systems, game machines, and the like, may include a display device for displaying images. The electronic devices may also include an input sensor that is capable of providing a touch-based input to allow users to intuitively input information or instructions in an interactive manner, in addition to a conventional input method such as a button, a keyboard, a mouse, and the like.

The input sensor may sense an event of a touch or a pressure input using a part of users' bodies. Meanwhile, pens or styluses have been increasingly popular among users who are accustomed to inputting information using a writing instrument or who have a need for providing accurate touch inputs for a specific application (e.g., sketching or drawing application).

SUMMARY

The present disclosure provides an electronic device having an improved sensing sensitivity and an interface system including the same.

According to an embodiment, an electronic device includes a display layer, a sensor layer disposed on the display layer, and a lower member that is disposed under the display layer and includes a first shielding layer. The sensor layer operates in a first touch mode for sensing a first input caused based on a capacitance change and a second touch mode for sensing a second input of an input device that is configured to emit a magnetic field, and the first shielding layer shields the magnetic field that is transmitted through the sensor layer.

The lower member may further include a first lower member disposed under the display layer and a second lower member disposed under the first lower member. The first shielding layer may be disposed between the first lower member and the second lower member.

The lower member may further include a second shielding layer spaced apart from the sensor layer with the first shielding layer interposed therebetween.

The first shielding layer may directly contact the second shielding layer.

The first shielding layer and the second shielding layer may be spaced apart from each other, and at least a portion of the first lower member or the second lower member included in the lower member may be disposed between the first shielding layer and the second shielding layer.

The lower member may further include a first lower member including a first lower layer disposed under the display layer and a second lower layer disposed under the first lower layer, and a second lower member including a third lower layer disposed under the first lower member and a fourth lower layer disposed under the third lower layer.

The first shielding layer may be directly disposed on a first surface of at least one of the first lower layer, the second lower layer, the third lower layer, or the fourth lower layer.

The lower member may further include a second shielding layer spaced apart from the sensor layer with the first shielding layer interposed therebetween, and the second shielding layer may be directly disposed on a second surface of at least one of the first shielding layer, the first lower layer, the second lower layer, the third lower layer, or the fourth lower layer.

The second lower layer may include a shock-absorbing material, and at least one of the third lower layer and the fourth lower layer may include a heat-dissipating material.

The lower member may further include a first lower layer disposed under the display layer and a second lower layer disposed under the first lower layer, and the first shielding layer may be disposed under the second lower layer.

The first shielding layer may include a material having a resistance and a magnetic permeability higher than copper.

The electronic device may further include a driver integrated chip (IC) that is electrically connected to the sensor layer and that controls an operation of the sensor layer, and the sensor layer may include a plurality of electrodes and a plurality of intersecting electrodes. In the first touch mode, the driver IC may calculate a first input coordinate by a user's touch, based on a change of mutual capacitance between the plurality of electrodes and the plurality of intersecting electrodes. In the second touch mode, the driver IC may calculate a second input coordinate by the input device using the plurality of electrodes or the plurality of intersecting electrodes.

Foldable areas may be respectively defined in the display layer and the sensor layer, and each of the foldable areas of the display layer and the sensor layer may be foldable to have a predetermined curvature.

According to an embodiment, an interface system includes an input device that is configured to emit a magnetic field and an electronic device including a display layer, a sensor layer disposed on the display layer, and a first shielding layer that is disposed under the display layer and shields the magnetic field transmitted through the sensor layer. The sensor layer operates in a first touch mode for sensing a first input based on a capacitance change and a second touch mode for sensing a second input of the input device.

The input device may include a signal generator that generates a signal, a power supply that supplies power to the signal generator, and a resonator that generates the magnetic field according to the signal.

The electronic device may further include a first lower layer disposed under the display layer and a second lower layer disposed under the first lower layer, and the first shielding layer may be attached to at least one of the first lower layer or the second lower layer or may directly contact one of the first lower layer or the second lower layer.

The electronic device may further include a second shielding layer spaced apart from the sensor layer with the first shielding layer interposed therebetween.

The first shielding layer may directly contact the second shielding layer.

The first shielding layer and the second shielding layer may be spaced apart from each other, and at least one layer may be disposed between the first shielding layer and the second shielding layer.

The electronic device may further include a driver IC that is configured to control an operation of the sensor layer, and the sensor layer may include a plurality of electrodes and a plurality of intersecting electrodes. In the first touch mode, the driver IC may calculate a first input coordinate by a user's touch, based on a change of mutual capacitance between the plurality of electrodes and the plurality of intersecting electrodes. In the second touch mode, the driver IC may calculate a second input coordinate by the input device using the plurality of electrodes or the plurality of intersecting electrodes.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1A:
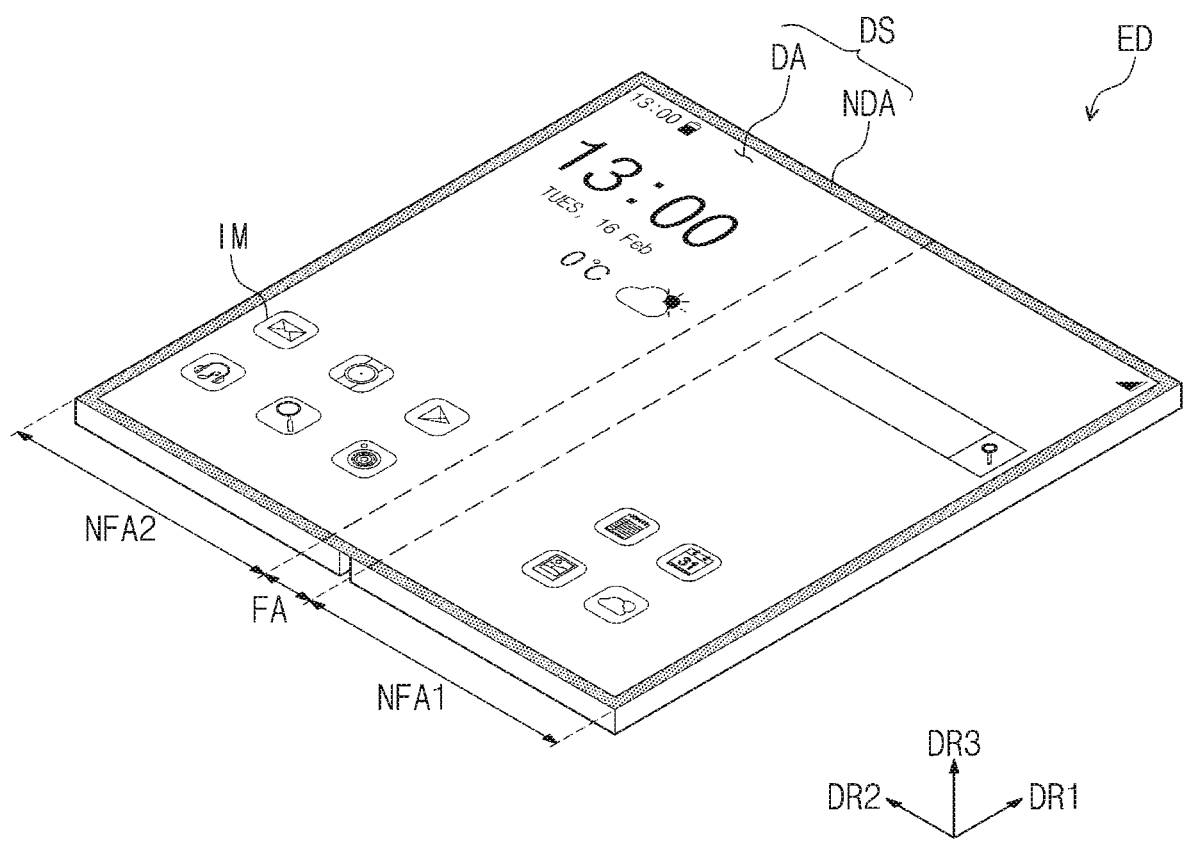
FIG. 1A and FIG. 1B are perspective views of an electronic device according to an embodiment of the present disclosure.

In the present disclosure, when it is described that a component (or, an area, a layer, a part, etc.) is referred to as being "on," "connected to," or "coupled to" another component, the component may be directly on, connected to, or coupled to the other component or a third component may be present therebetween.

Identical reference numerals refer to identical components unless explicitly described otherwise. Additionally, in the drawings, the thicknesses, proportions, and dimensions of components may be exaggerated for effective description. As used herein, the term "and/or" includes all of one or more combinations defined by the listed components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include a plural form unless otherwise specified.

In addition, terms such as "below," "under," "above," "on," and "over" are used to describe a relationship of components illustrated in the drawings. The terms are relative concepts and are described based on directions illustrated in the drawing.

It should be understood that terms such as "comprise," "include," and "have," when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present disclosure.

Hereinafter, some embodiments of the present disclosure will be described with reference to the accompanying drawings.

Figure 1B:
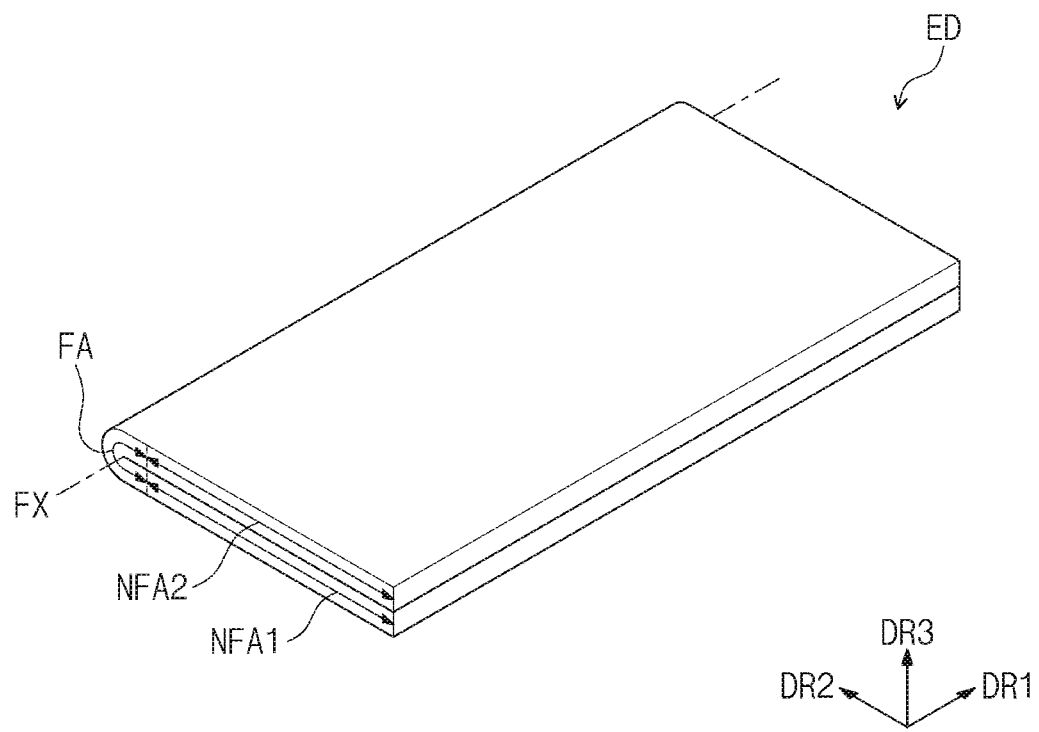

FIG. 1A and FIG. 1B are perspective views of an electronic device according to an embodiment of the present disclosure.

FIG. 1A illustrates a flat state (or an unfolded state) of an electronic device ED, and FIG. 1B illustrates a folded state of the electronic device ED.

Referring to FIGS. 1A and 1B, the electronic device ED may be activated in response to an electrical signal. For example, the electronic device ED may be, but is not limited to, a mobile phone, a foldable mobile phone, a tablet computer, a car navigation system, a game machine, or a wearable device. FIGS. 1A and 1B illustrate an example that the electronic device ED is a foldable mobile phone. However, the electronic device ED is not particularly limited thereto.

The electronic device ED may include a display surface DS defined by a first direction DR1 and a second direction DR2 that crosses the first direction DR1. The electronic device ED may display an image IM to a user through the display surface DS.

The display surface DS may include a display area DA and a non-display area NDA around the display area DA. The display area DA may display the image IM, and the non-display area NDA may not display the image IM. The non-display area NDA may surround the display area DA. However, without being limited thereto, the shape of the display area DA and the shape of the non-display area NDA may be variously modified without deviating from the scope of the present disclosure.

Hereinafter, a direction substantially perpendicular to a plane defined by the first direction DR1 and the second direction DR2 may be defined as a third direction DR3. Furthermore, the expression "on the plane" used herein may refer to a state viewed in the third direction DR3.

The electronic device ED may include a folding area FA (or a foldable area) and a plurality of non-folding areas NFA1 and NFA2. The non-folding areas NFA1 and NFA2 may include the first non-folding area NFA1 and the second non-folding area NFA2. The folding area FA may be disposed between the first non-folding area NFA1 and the second non-folding area NFA2. The first non-folding area NFA1, the folding area FA, and the second non-folding area NFA2 may be sequentially defined in the electronic device ED along the second direction DR2.

As illustrated in FIG. 1B, the folding area FA may be folded about a folding axis FX that may be parallel to the first direction DR1. The folding area FA may extend along the first direction DR1. The folding area FA may be folded, for example, with a predetermined radius of curvature. The electronic device ED may be folded in an in-folding manner such that the first non-folding area NFA1 and the second non-folding area NFA2 face each other, and the display surface DS is not exposed to the outside in the folded state.

In another embodiment of the present disclosure, the electronic device ED may be folded in an out-folding manner such that the display surface DS is exposed to the outside in the folded state. In another embodiment of the present disclosure, the electronic device ED may be configured such that an in-folding motion and/or an out-folding motion is/are repeatedly performed from an unfolding motion. However, the present disclosure is not limited thereto. In an embodiment of the present disclosure, the electronic device ED may be configured to selectively perform one of an unfolding motion, an in-folding motion, or an out-folding motion.

Figure 2:
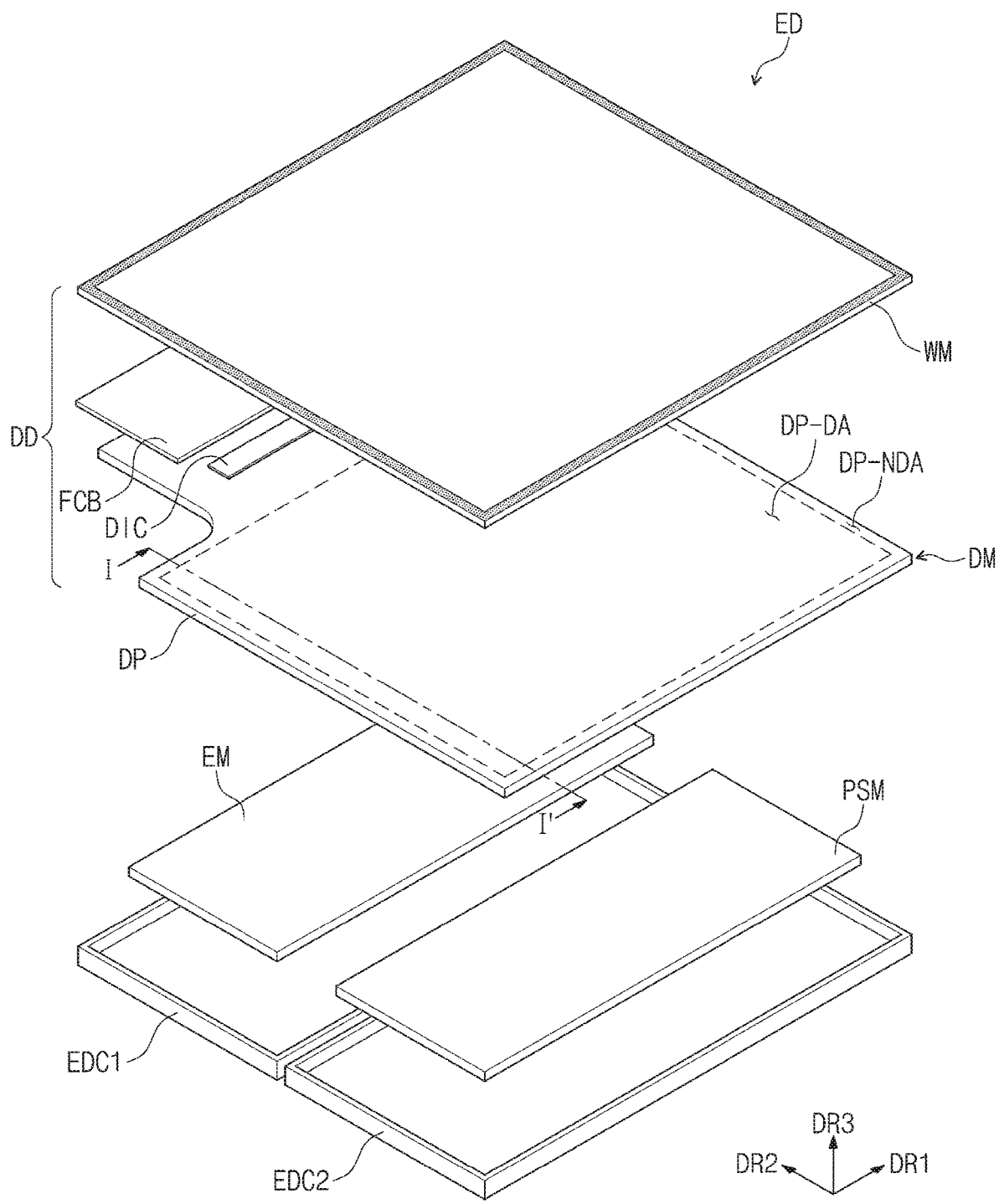
FIG. 2 is an exploded perspective view of the electronic device according to an embodiment of the present disclosure.

FIG. 2 is an exploded perspective view of the electronic device ED according to an embodiment of the present disclosure.

Referring to FIG. 2, the electronic device ED may include a display device DD, an electronic module EM, a power supply module PSM, and cases EDC1 and EDC2. Although not separately illustrated, the electronic device ED may further include a mechanical structure for controlling a folding motion of the display device DD.

The display device DD may generate an image and may sense an external input. The display device DD may include a window module WM and a display module DM. The window module WM may provide a front side (or surface) of the electronic device ED.

The display module DM may include at least a display panel DP. Although FIG. 2 illustrates that the display module DM is the same as the display panel DP, the display module DM may be a stacked structure having a plurality of components stacked one above another. The stacked structure of the display module DM will be described below in detail.

The display panel DP may include a display area DP-DA and a non-display area DP-NDA that respectively correspond to the display area DA (refer to FIG. 1A) and the non-display area NDA (refer to FIG. 1A) of the electronic device ED. The expression "an area/portion corresponds to an area/portion" used herein may mean that the areas/portions overlap each other and is not limited to having the same area/portion.

The display module DM may include a driver integrated circuit DIC disposed on the non-display area DP-NDA. The display module DM may further include a circuit film FCB coupled to the non-display area DP-NDA.

The driver integrated circuit DIC may include driving elements (e.g., a data driving circuit) for driving pixels of the display panel DP. Although FIG. 2 illustrates an example in which the driver integrated circuit DIC is mounted on the display panel DP, the present disclosure is not limited thereto. In another example, the driver integrated circuit DIC may be mounted on the circuit film FCB.

The electronic module EM may include at least a main driver (or a main controller). The electronic module EM may also include a wireless communication module, a camera module, a proximity sensor module, an image input module, a sound input module, a sound output module, a memory, and/or an external interface module. The electronic module EM may be electrically connected to the power supply module PSM.

The main driver may control overall operation of the electronic device ED. For example, the main driver may activate or deactivate the display device DD in response to a user input. The main driver may control operations of other modules of the electronic device ED as well as the display device DD. The main driver may include at least one microprocessor or microcontroller.

The cases EDC1 and EDC2 may accommodate the display module DM, the electronic module EM, and the power supply module PSM. Although FIG. 2 illustrates an example in which the two cases EDC1 and EDC2 are separated from each other, the present disclosure is not limited thereto. Although not illustrated, the electronic device ED may further include a hinge structure for connecting the two cases EDC1 and EDC2. The cases EDC1 and EDC2 may be coupled with the window module WM. The cases EDC1 and EDC2 may protect components and modules (e.g., the display module DM, the electronic module EM, the power supply module PSM, and the like) that are accommodated in the cases EDC1 and EDC2.

Figure 3:
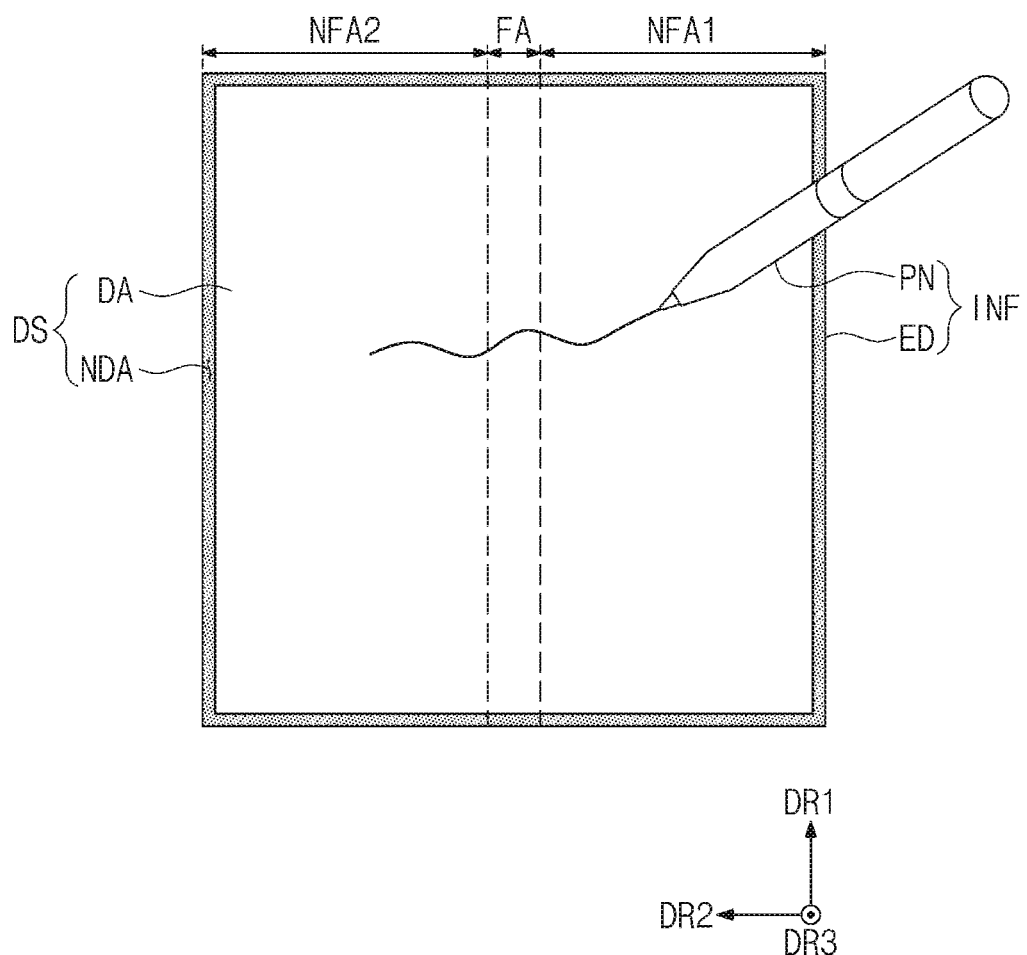
FIG. 3 is a view illustrating an interface system according to an embodiment of the present disclosure.

FIG. 3 is a view illustrating an interface system according to an embodiment of the present disclosure.

Referring to FIG. 3, an interface system INF may include the electronic device ED and an input device PN. The interface system INF may also be referred to as an electronic system, a touch system, an input/output system, a digitizer system, a pen tablet, or a pen terminal.

The input device PN may generate a magnetic field having a predetermined resonant frequency. The input device PN may be configured to generate and transmit an output signal based on an electromagnetic resonance scheme. The input device PN may also be referred to as a pen, an input pen, a magnetic pen, a stylus pen, or an electromagnetic resonance pen.

The input device PN may include a signal generator that provides a power (e.g., alternating current (AC) power). In this case, the input device PN may generate an induced current through the signal generator even in the absence of an external magnetic field provided from the outside. Accordingly, the electronic device ED without including a digitizer that forms a magnetic field may sense an input of the input device PN based on a magnetic field that is output from the input device PN.

The input device PN based on the electromagnetic resonance scheme may have higher output efficiency than an active electrostatic (AES) pen. For example, for a transmit signal (hereinafter also referred to as Tx signal) having the same frequency (e.g., 1.8 MHz) and the same input voltage (e.g., 17V), the strength of a signal output from the input device PN may be about 40 times greater than the strength of a signal output from the AES pen. Furthermore, the strength of an output signal of the input device PN for a Tx signal having a frequency of 1.8 MHz and a voltage of 1V may be equivalent to the strength of an output signal of the AES pen for a Tx signal having a frequency of 1.8 MHz and a voltage of 17V. Accordingly, the input device PN operating in an active mode may have lower battery consumption than the AES pen.

When the input device PN is included in the interface system INF, the electronic device ED may not include a digitizer. In this case, the thickness and weight of the electronic device ED that may be otherwise increased due to the addition of a digitizer may be reduced while providing flexibility. The electronic device ED without including a digitizer may sense an input of the input device PN using a sensor layer, which will be described below in detail.

Figure 4A:
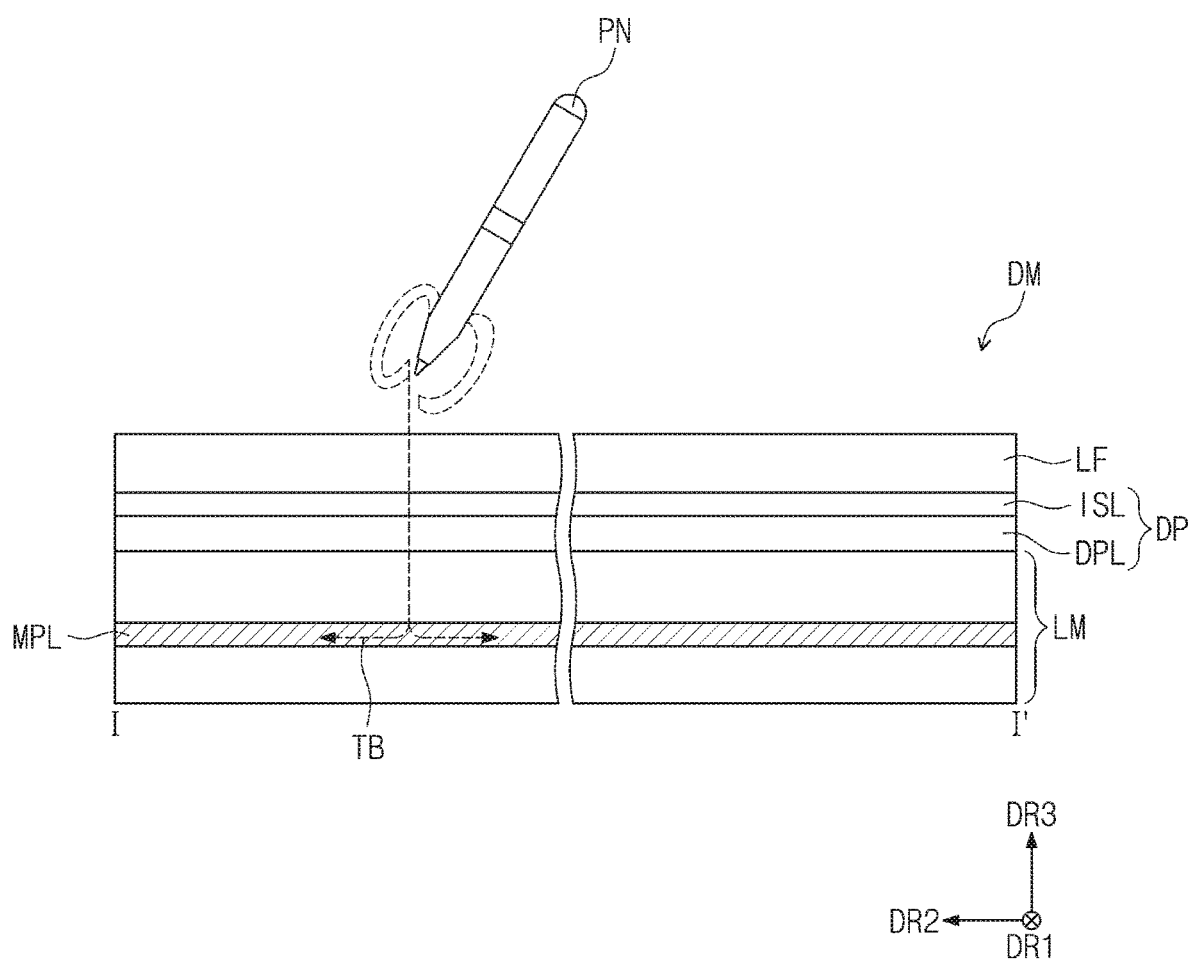
FIG. 4A is a sectional view of a display module according to an embodiment of the present disclosure.

FIG. 4A is a sectional view of the display module DM according to an embodiment of the present disclosure.

Referring to FIG. 4A, the display module DM may include the display panel DP, an optical film LF disposed on the display panel DP, and a lower member LM disposed under the display panel DP in the third direction DR3. The display panel DP may include a display layer DPL and a sensor layer ISL disposed on the display layer DPL. An adhesive layer (not shown) may be disposed between the display layer DPL and the sensor layer ISL.

The display layer DPL may generate an image. In an embodiment, the display layer DPL may be an emissive display layer. For example, the display layer DPL may be an organic light emitting display layer, an inorganic light emitting display layer, an organic-inorganic light emitting display layer, a quantum dot display layer, a micro-light emitting diode (LED) display layer, or a nano-LED display layer.

The sensor layer ISL may be disposed on the display layer DPL. The sensor layer ISL may sense an external input applied thereto from the outside. In an embodiment, the sensor layer ISL may be an external layer attached to the display layer DPL. In another embodiment, the sensor layer ISL may be an integrated layer continuously formed in or as a part of a manufacturing process of the display layer DPL.

The sensor layer ISL may operate in a first touch mode for sensing an input caused by a capacitance change and a second touch mode for sensing an input received from the input device PN that emits a magnetic field. That is, the display module DM without including a digitizer may be capable of sensing not only an input by a user's touch but also an input received from the input device PN by using the sensor layer ISL.

The optical film LF disposed on the display panel DP may lower the reflectance of light incident from the outside. In an embodiment, the optical film LF may include a phase retarder and/or a polarizer. The optical film LF may include at least a polarizer film.

In another embodiment, the optical film LF may include color filers. The color filters may have a predetermined arrangement. The arrangement of the color filters may be determined according to emission colors of pixels PX (refer to FIG. 6) included in the display layer DPL. In addition, the optical film LF may further include a black matrix disposed adjacent to the color filters.

In yet another embodiment, the optical film LF may include a destructive interference structure. For example, the destructive interference structure may include a first reflective layer and a second reflective layer that are disposed in different layers. First reflected light and second reflected light respectively reflected from the first reflective layer and the second reflective layer may destructively interfere with each other, thereby decreasing the reflectance of external light.

The lower member LM may include various functional layers. In particular, according to the present embodiment, the lower member LM may include a first shielding layer MPL. The first shielding layer MPL may contain magnetic metal powder. In this case, the first shielding layer MPL may be referred to as a magnetic metal powder layer, a magnetic layer, a magnetic circuit layer, or a magnetic path layer.

The first shielding layer MPL may shield a magnetic field TB that may be transmitted through the sensor layer ISL. The first shielding layer MPL may provide a magnetic path for the magnetic field TB that is output from the input device PN and transmits through the sensor layer ISL. The first shielding layer MPL may also serve to induce the direction of the magnetic field TB to a different direction, and may change the direction of the magnetic field TB that may be transmitted through the sensor layer ISL. Accordingly, the magnetic field TB reaching the first shielding layer MPL may be shielded without being leaked to other layers, for example, to a layer that is placed under the first shielding layer MPL. In this case, the first shielding layer MPL may prevent or reduce an eddy current caused by a change of the magnetic field TB. As a result, the first shielding layer MPL may reduce a degree of attenuation to the strength of a signal (e.g., the magnetic field TB) provided by the input device PN.

With an increase in the size of the display module DM, a resistance difference according to an input position of the input device PN may cause a signal strength difference. According to the embodiment of the present disclosure, the display module DM without including a digitizer may include the first shielding layer MPL to shield the magnetic field TB, and the first shielding layer MPL may reduce a degree of attenuation to the strength of the magnetic field TB provided by the input device PN. That is, the reduced attenuation of the strength of the magnetic field TB provided by the input device PN may compensate for the signal attenuation that may be caused by a resistance difference according to an input position. Accordingly, despite a decrease in a current value, the current value even at a point of the greatest resistance may still be equal to or greater than a predetermined value. As a result, the first shielding layer MPL included in the display module DM may improve the sensing sensitivity of the sensor layer ISL.

In an embodiment of the present disclosure, the first shielding layer MPL may entirely overlap the folding area FA, the first non-folding area NFA1, and the second non-folding area NFA2 illustrated in FIG. 1A. Accordingly, a degree of attenuation to the strength of a signal (e.g., the magnetic field TB, refer to FIG. 4A) provided by the input device PN may be reduced in the entire areas overlapping the folding area FA, the first non-folding area NFA1, and the second non-folding area NFA2.

Figure 4B:
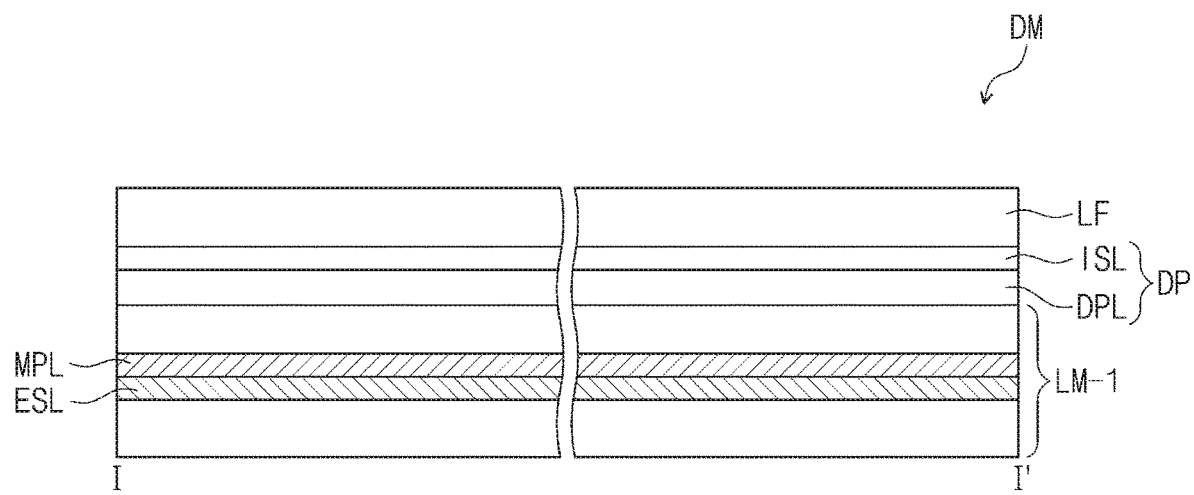
FIG. 4B is a sectional view of a display module according to another embodiment of the present disclosure.
Figure 4B:
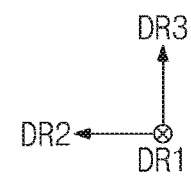

FIG. 4B is a sectional view of the display module DM according to another embodiment of the present disclosure.

Referring to FIG. 4B, a lower member LM-1 may include various functional layers. In particular, according to the present embodiment, the lower member LM-1 may include a first shielding layer MPL and a second shielding layer ESL.

The second shielding layer ESL may be spaced apart from the sensor layer ISL with the first shielding layer MPL therebetween. The second shielding layer ESL may shield an electromagnetic field or noise that may be emanating from a module disposed under the sensor layer ISL. The second shielding layer ESL may be formed of aluminum, magnesium, a magnesium alloy, stainless steel, copper, or a copper alloy, but is not particularly limited thereto. The second shielding layer ESL may be referred to as an electromagnetic shielding layer.

The second shielding layer ESL may directly contact the first shielding layer MPL. In this case, a separate layer, for example, an adhesive layer, may not be disposed between the second shielding layer ESL and the first shielding layer MPL.

Figure 4C:
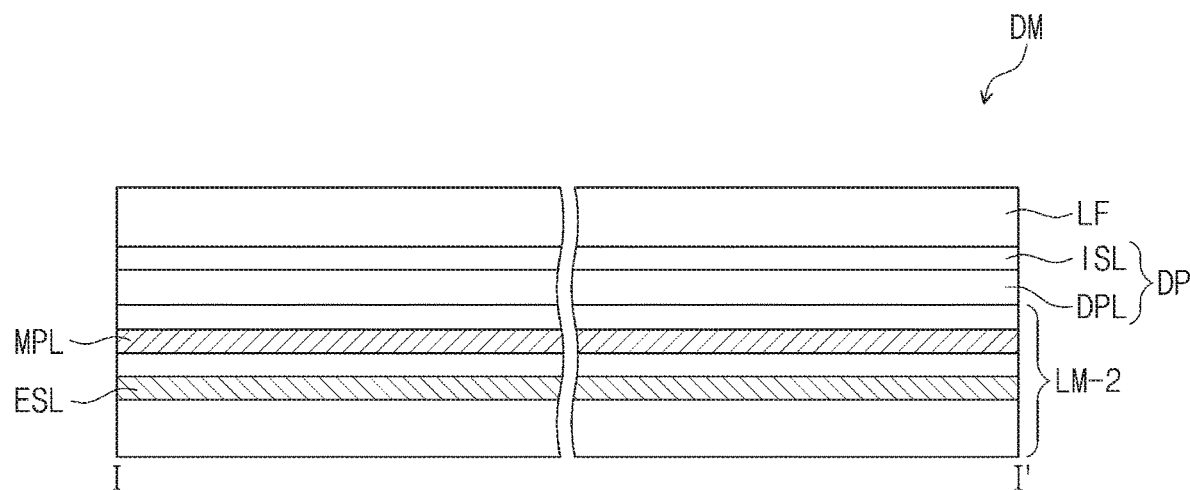
FIG. 4C is a sectional view of a display module according to another embodiment of the present disclosure.
Figure 4C:
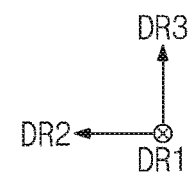

FIG. 4C is a sectional view of the display module DM according to another embodiment of the present disclosure.

Referring to FIG. 4C, a lower member LM-2 may include a first shielding layer MPL and a second shielding layer ESL. The second shielding layer ESL may be spaced apart from the first shielding layer MPL. According to the present embodiment, the lower member LM-2 may include another layer that is disposed between the second shielding layer ESL and the first shielding layer MPL, for example, an adhesive layer, but the present embodiment is not particularly limited thereto.

Figure 5:
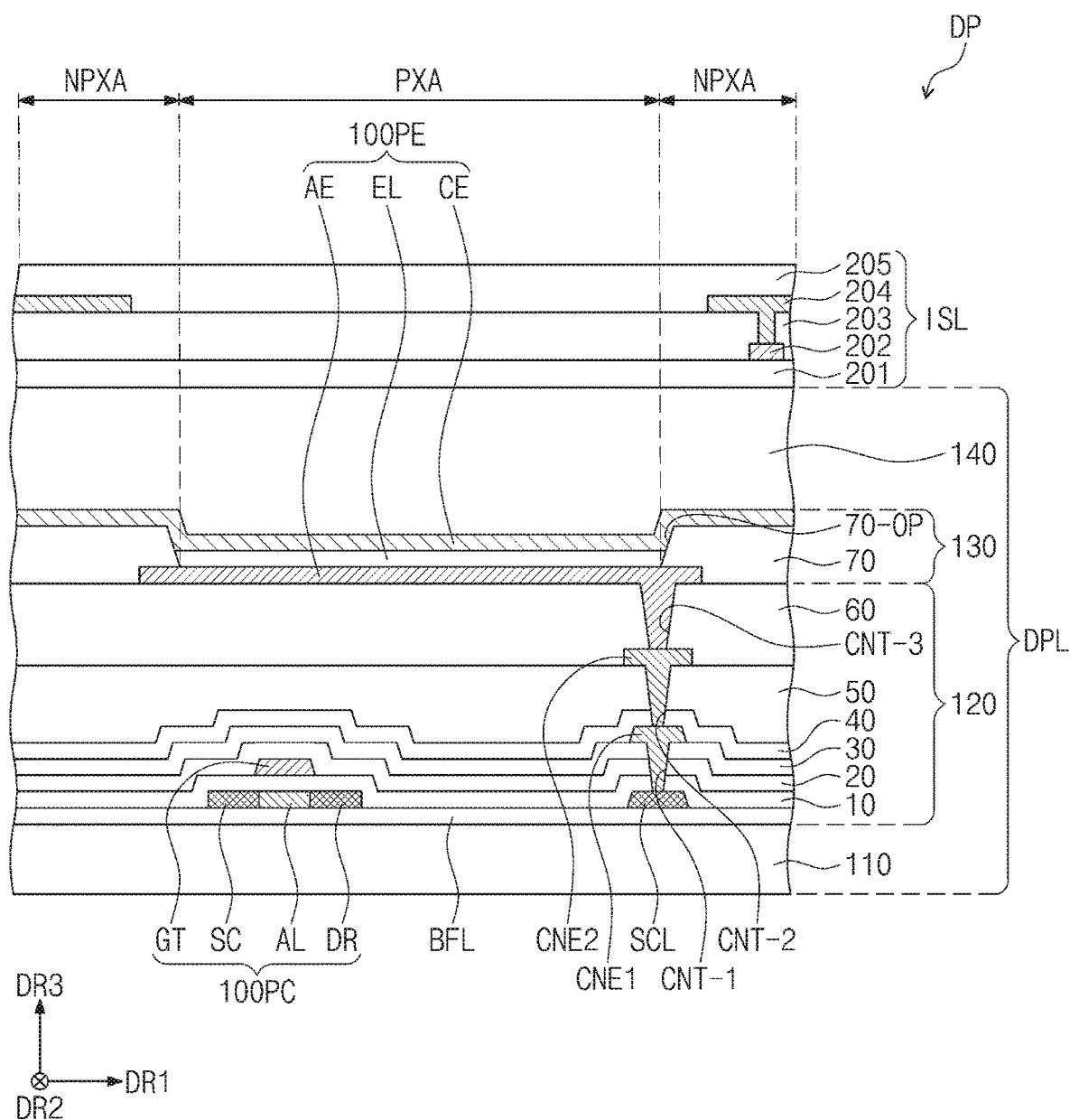
FIG. 5 is a sectional view of a display panel according to an embodiment of the present disclosure.

FIG. 5 is a sectional view of the display panel DP according to an embodiment of the present disclosure.

Referring to FIG. 5, the display layer DPL may include a base layer 110, a circuit layer 120, a light emitting element layer 130, and an encapsulation layer 140.

The base layer 110 may provide a surface on which the circuit layer 120 is disposed. The base layer 110 may be a glass substrate, a metal substrate, a polymer substrate, or the like. However, without being limited thereto, the base layer 110 may be an inorganic layer, an organic layer, a composite layer, or any combination thereof.

The base layer 110 may have a multi-layer structure. For example, the base layer 110 may include a first synthetic resin layer, a silicon oxide ($SiO_x$) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be collectively referred to as a base barrier layer.

Each of the first synthetic resin layer and the second synthetic resin layer may contain a polyimide-based resin. Alternatively, each of the first synthetic resin layer and the second synthetic resin layer may contain at least one of an acrylate-based resin, a methacrylate-based resin, a polyisoprene-based resin, a vinyl-based resin, an epoxy-based resin, a urethane-based resin, a celluose-based resin, a siloxane-based resin, a polyamide-based resin, or a perylene-based resin. Meanwhile, a "x"-based resin used herein may refer to a resin containing a functional group of "x".

At least one inorganic layer may be formed on an upper surface of the base layer 110. The inorganic layer may contain at least one of aluminum oxide, titanium oxide, silicon oxide, silicon nitride, silicon oxynitride, zirconium oxide, or hafnium oxide. The inorganic layer may include multiple layers, for example, a barrier layer and/or a buffer layer. In the present embodiment, FIG. 5 illustrates an example of the display layer DPL including a buffer layer BFL.

The buffer layer BFL may improve a coupling between the base layer 110 and a semiconductor pattern that may be formed thereon. The buffer layer BFL may contain at least one of silicon oxide, silicon nitride, or silicon oxynitride. For example, the buffer layer BFL may have a stacked structure in which at least one silicon oxide layer and at least one silicon nitride layer are alternately stacked one above another.

The semiconductor pattern may be disposed on the buffer layer BFL. The semiconductor pattern may contain polysilicon. However, without being limited thereto, the semiconductor pattern may contain amorphous silicon, low-temperature polycrystalline silicon, or oxide semiconductor.

It is noted that FIG. 5 illustrates only a part of the semiconductor pattern, and the semiconductor pattern may be additionally disposed in another area that is not shown in FIG. 5. The semiconductor pattern may be arranged across pixels PX (refer to FIG. 6) according to a predetermined pattern. The semiconductor pattern may have different electrical properties depending on the semiconductor pattern being doped or not. The semiconductor pattern may include a first area having a high conductivity and a second area having a low conductivity. The first area may be doped with an N-type dopant or a P-type dopant. For example, a P-type transistor may include a doped area doped with a P-type dopant, and an N-type transistor may include a doped area doped with an N-type dopant. The second area may correspond to an undoped area, or may correspond to an area that is more lightly doped than the first area.

The first area may have a higher electrical conductivity than the second area and may substantially serve as an electrode or a signal line. The second area may substantially correspond to an active area of a transistor. In other words, one portion of the semiconductor pattern may correspond to an active area of a transistor, another portion may correspond to a source or a drain of the transistor, and yet another portion may correspond to a connecting electrode or a connecting signal line.

Each of the pixels PX may have an equivalent circuit including one or more transistors (e.g., seven transistors), at least one capacitor, and a light emitting element, and the equivalent circuit of the pixel PX may be modified in various forms without deviating from the scope of the present disclosure. FIG. 5 illustrates a pixel PX that includes one transistor 100PC and one light emitting element 100PE.

A source area SC, an active area AL, and a drain area DR of the transistor 100PC may be formed from the semiconductor pattern. The source area SC and the drain area DR may extend from the active area AL in opposite directions in a cross-sectional view. FIG. 5 also illustrates a part of a connecting signal line SCL formed from the semiconductor pattern. Although not separately illustrated, the connecting signal line SCL may be connected to the drain area DR of the transistor 100PC in a plan view.

A first insulating layer 10 may be disposed on the buffer layer BFL. The first insulating layer 10 may commonly overlap a plurality of pixels PX and may cover the semiconductor pattern. The first insulating layer 10 may be an inorganic layer and/or an organic layer and may have a single layer structure or a multi-layer structure. The first insulating layer 10 may contain at least one of aluminum oxide, titanium oxide, silicon oxide, silicon nitride, silicon oxynitride, zirconium oxide, or hafnium oxide. In an embodiment, the first insulating layer 10 may be a single layer of silicon oxide, but the present disclosure is not limited thereto. Other insulating layers of the circuit layer 120 to be described below may be inorganic layers and/or organic layers and may have a single layer structure or a multi-layer structure. The inorganic layers may contain at least one of the aforementioned materials, but are not limited thereto.

A gate GT of the transistor 100PC may be disposed on the first insulating layer 10. The gate GT may be formed as a part of a metal pattern. The gate GT may overlap the active area AL. The gate GT may serve as a mask in a process of doping the semiconductor pattern.

A second insulating layer 20 may be disposed on the first insulating layer 10 and may cover the gate GT. The second insulating layer 20 may commonly overlap the pixels PX. The second insulating layer 20 may be an inorganic layer and/or an organic layer and may have a single layer structure or a multi-layer structure. The second insulating layer 20 may contain at least one of silicon oxide, silicon nitride, or silicon oxynitride. In an embodiment, the second insulating layer 20 may have a multi-layer structure including a silicon oxide layer and a silicon nitride layer, but the present disclosure is not limited thereto.

A third insulating layer 30 may be disposed on the second insulating layer 20. The third insulating layer 30 may have a single layer structure or a multi-layer structure. In an embodiment, the third insulating layer 30 may have a multi-layer structure including a silicon oxide layer and a silicon nitride layer, but the present disclosure is not limited thereto.

A first connecting electrode CNE1 may be disposed on the third insulating layer 30. The first connecting electrode CNE1 may be connected to the connecting signal line SCL through a contact hole CNT-1 that is formed through the first insulating layer 10, the second insulating layer 20, and the third insulating layer 30.

A fourth insulating layer 40 may be disposed on the third insulating layer 30. The fourth insulating layer 40 may be a single layer of silicon oxide. A fifth insulating layer 50 may be disposed on the fourth insulating layer 40. The fifth insulating layer 50 may be an organic layer.

A second connecting electrode CNE2 may be disposed on the fifth insulating layer 50. The second connecting electrode CNE2 may be connected to the first connecting electrode CNE1 through a contact hole CNT-2 that is formed through the fourth insulating layer 40 and the fifth insulating layer 50.

A sixth insulating layer 60 may be disposed on the fifth insulating layer 50 and may cover the second connecting electrode CNE2. The sixth insulating layer 60 may be an organic layer.

The light emitting element layer 130 may be disposed on the circuit layer 120. The light emitting element layer 130 may include the light emitting element 100PE. For example, the light emitting element layer 130 may include an organic light emitting material, a quantum dot, a quantum rod, a micro-LED, or a nano-LED. Hereinafter, an organic light emitting element will be described as an example of the light emitting element 100PE. However, the light emitting element 100PE is not particularly limited thereto.

The light emitting element 100PE may include a first electrode AE, an emissive layer EL, and a second electrode CE.

The first electrode AE of the light emitting element 100PE may be disposed on the sixth insulating layer 60. The first electrode AE may be connected to the second connecting electrode CNE2 through a contact hole CNT-3 that is formed through the sixth insulating layer 60.

A pixel defining layer 70 may be disposed on the sixth insulating layer 60 and may cover part of the first electrode AE. An opening 70-OP may be formed in the pixel defining layer 70. At least part of the first electrode AE may be exposed through the opening 70-OP of the pixel defining layer 70.

The display area DA (refer to FIG. 1A) may include an emissive area PXA and a non-emissive area NPXA adjacent to the emissive area PXA. The non-emissive area NPXA may surround the emissive area PXA. In an embodiment, the emissive area PXA may correspond to a partial area of the first electrode AE that is exposed through the opening 70-OP.

The emissive layer EL of the light emitting element 100PE may be disposed on the first electrode AE. The emissive layer EL may be disposed in an area corresponding to the opening 70-OP. That is, the emissive layer EL may be separately formed for each of the pixels PX. When the emissive layer EL is separately formed for each of the pixels, each of the emissive layers EL may emit at least one of blue light, red light, or green light. However, without being limited thereto, the emissive layer EL may be commonly formed to correspond to the plurality of pixels PX. In this case, the emissive layer EL may provide blue light or white light.

The second electrode CE of the light emitting element 100PE may be disposed on the emissive layer EL. The second electrode CE may have an integrated shape and may be commonly disposed to correspond to the plurality of pixels PX.

Although not illustrated, a hole control layer (HCL) may be disposed between the first electrode AE and the emissive layer EL. The hole control layer may be commonly disposed to correspond to the emissive area PXA and the non-emissive area NPXA. The hole control layer may include a hole transporting layer (HTL) and may further include a hole injection layer (HIL). An electron control layer (ECL) may be disposed between the emissive layer EL and the second electrode CE. The electron control layer may include an electron transporting layer (ETL) and may further include an electron injection layer (EIL). The hole control layer and the electron control layer may be commonly formed to correspond to the plurality of pixels PX by using an open mask (not shown).

The encapsulation layer 140 may be disposed on the light emitting element layer 130. The encapsulation layer 140 may include an inorganic layer, an organic layer, and an inorganic layer that are sequentially stacked one above another. However, layers constituting the encapsulation layer 140 are not limited thereto.

The inorganic layer may protect the light emitting element layer 130 from moisture and/or oxygen, and the organic layer may protect the light emitting element layer 130 from foreign matters such as dust particles. The inorganic layers may include a silicon nitride layer, a silicon oxynitride layer, a silicon oxide layer, a titanium oxide layer, or an aluminum oxide layer. The organic layer may include, but is not limited to, an acrylate-based organic layer.

The sensor layer ISL may include a base layer 201, a first conductive layer 202, a sensing insulation layer 203, a second conductive layer 204, and a cover insulation layer 205.

The base layer 201 may be an inorganic layer containing at least one of silicon nitride, silicon oxynitride, or silicon oxide. Alternatively, the base layer 201 may be an organic layer containing an epoxy resin, an acrylic resin, or a polyimide-based resin. The base layer 201 may have a single layer structure, or may have a multi-layer structure including multiple layers stacked in the third direction DR3.

Each of the first conductive layer 202 and the second conductive layer 204 may have a single layer structure, or may have a multi-layer structure including multiple layers stacked in the third direction DR3.

The conductive layer (e.g., the first conductive layer 202, the second conductive layer 204) having a single layer structure may include a metal layer or a transparent conductive layer. The metal layer may contain molybdenum, silver, titanium, copper, aluminum, or an alloy thereof. The transparent conductive layer may contain transparent conductive oxide such as indium tin oxide (ITO), indium zinc oxide (IZO), zinc oxide (ZnO), indium zinc tin oxide (IZTO), or the like. In addition, the transparent conductive layer may contain a conductive polymer such as poly(3,4-ethylenedioxythiophene) polystyrene sulfonate (PEDOT), a metal nano wire, graphene, or the like.

The conductive layer (e.g., the first conductive layer 202, the second conductive layer 204) having a multi-layer structure may include a plurality of metal layers. The multi-layer structure may have, for example, a three-layer structure of titanium/aluminum/titanium. The conductive layer having a multi-layer structure may include at least one metal layer and at least one transparent conductive layer.

At least one of the sensing insulation layer 203 or the cover insulation layer 205 may include an inorganic layer. The inorganic layer may contain at least one of aluminum oxide, titanium oxide, silicon oxide, silicon nitride, silicon oxynitride, zirconium oxide, or hafnium oxide.

At least one of the sensing insulation layer 203 or the cover insulation layer 205 may include an organic layer. The organic layer may contain at least one of an acrylate-based resin, a methacrylate-based resin, a polyisoprene-based resin, a vinyl-based resin, an epoxy-based resin, a urethane-based resin, a celluose-based resin, a siloxane-based resin, a polyimide-based resin, a polyamide-based resin, or a perylene-based resin.

Figure 6:
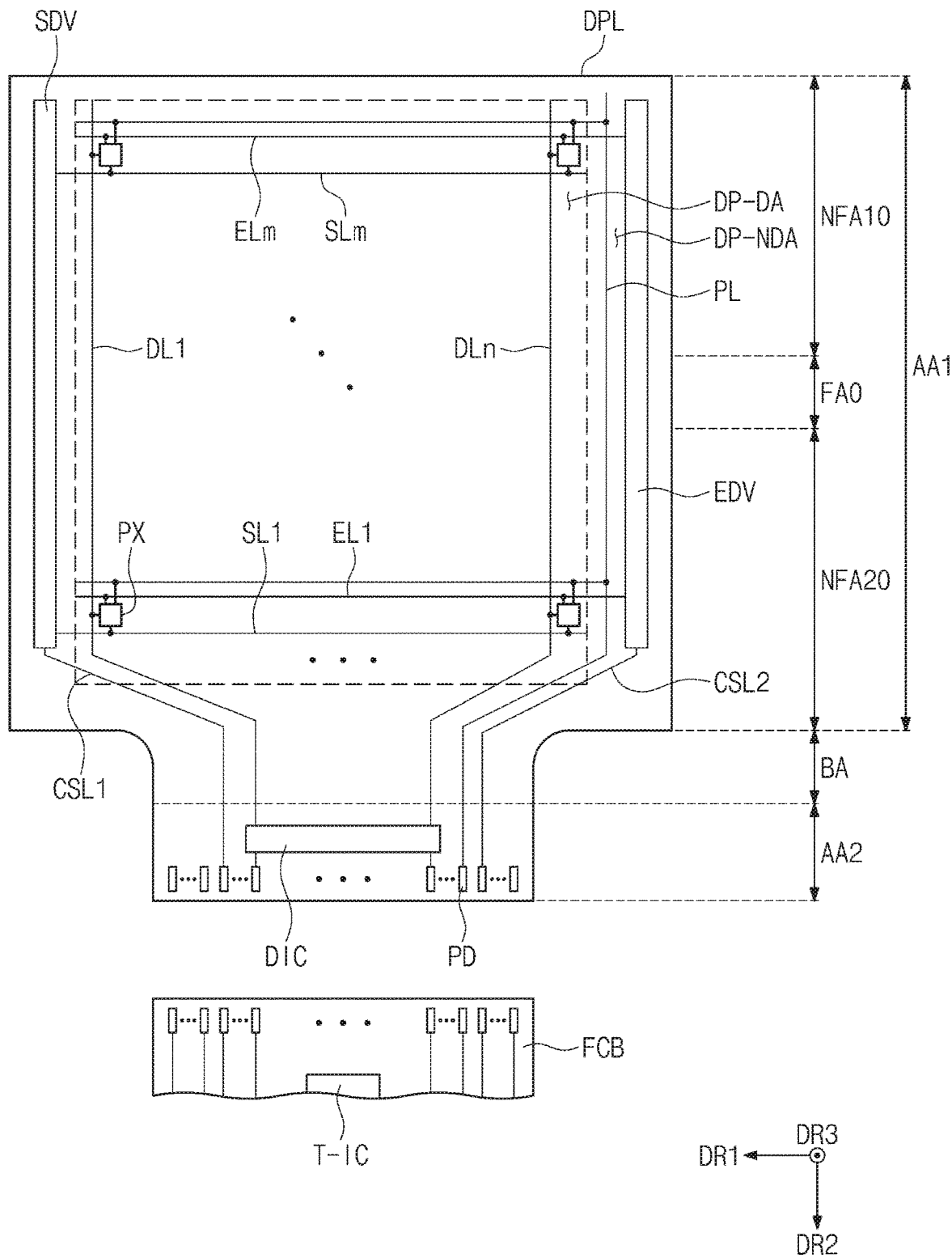
FIG. 6 is a plan view of a display layer according to an embodiment of the present disclosure.

FIG. 6 is a plan view of the display layer DPL according to an embodiment of the present disclosure.

Referring to FIG. 6, the display area DP-DA and the non-display area DP-NDA around the display area DP-DA may be defined in the display layer DPL. The display area DP-DA and the non-display area DP-NDA may be distinguished from each other depending on the disposition of the pixels PX. The pixels PX may be disposed in the display area DP-DA. A scan driver SDV, a data driver (not shown), and an emission driver EDV may be disposed in the non-display area DP-NDA. The data driver may be a circuit formed in the driver integrated circuit DIC (refer to FIG. 2).

The display layer DPL may include a first panel area AA1, a bending area BA, and a second panel area AA2 that are defined along the second direction DR2. The second panel area AA2 and the bending area BA may correspond to partial areas of the non-display area DP-NDA. The bending area BA may be disposed between the first panel area AA1 and the second panel area AA2.

The first panel area AA1 may correspond to the display surface DS of the electronic device ED as illustrated in FIG. 1A. The first panel area AA1 may include a first non-folding area NFA10, a second non-folding area NFA20, and a folding area FAO. The first non-folding area NFA10, the second non-folding area NFA20, and the folding area FAO may respectively correspond to the first non-folding area NFA1, the second non-folding area NFA2, and the folding area FA of FIGS. 1A and 1B.

The width of the bending area BA and the width (or length) of the second panel area AA2 in the first direction DR1 may be smaller than the width (or length) of the first panel area AA1 in the first direction DR1. The bending area BA and the second panel area AA2 having a smaller width in the direction of a bending axis may be more easily bent than the first panel area AA1 having a larger width.

The display layer DPL may include a plurality of pixels PX, a plurality of scan lines SL1 to SLm, a plurality of data lines DL1 to DLn, a plurality of emission lines EL1 to ELm, a first control line CSL1, a second control line CSL2, a power line PL, and a plurality of pads PD. Here, "m" and "n" are natural numbers. The pixels PX may be connected to the scan lines SL1 to SLm, the data lines DL1 to DLn, and the emission lines EL1 to ELm.

The scan lines SL1 to SLm may extend in the first direction DR1 and may be electrically connected to the scan driver SDV. The data lines DL1 to DLn may extend in the second direction DR2 and may be electrically connected to the driver integrated circuit DIC via the bending area BA. The emission lines EL1 to ELm may extend in the first direction DR1 and may be electrically connected to the emission driver EDV.

The power line PL may include a portion extending in the second direction DR2 and a portion extending in the first direction DR1. The portion extending in the first direction DR1 and the portion extending in the second direction DR2 may be disposed on different layers. The portion of the power line PL that extends in the second direction DR2 may extend to the second panel area AA2 via the bending area BA. The power line PL may provide a first voltage to the pixels PX.

The first control line CSL1 may be connected to the scan driver SDV and may extend toward a lower end of the second panel area AA2 via the bending area BA. The second control line CSL2 may be connected to the emission driver EDV and may extend toward the lower end of the second panel area AA2 via the bending area BA.

The pads PD may be disposed adjacent to the lower end of the second panel area AA2 in the plan view. The driver integrated circuit DIC, the power line PL, the first control line CSL1, and the second control line CSL2 may be electrically connected to the pads PD. The circuit film FCB may be electrically connected to the pads PD through an anisotropic conductive adhesive layer (not shown).

Figure 7:
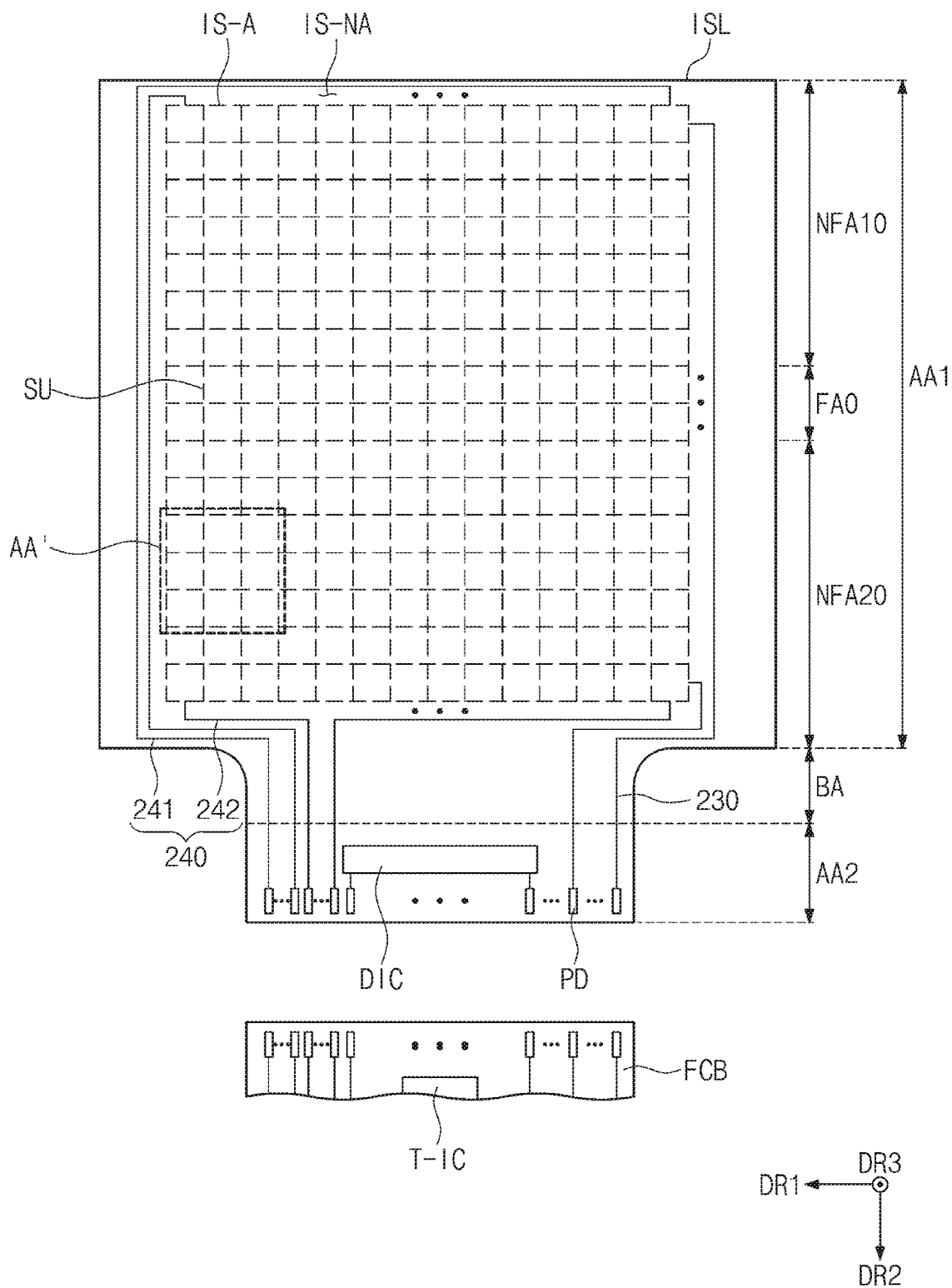
FIG. 7 is a plan view of a sensor layer according to an embodiment of the present disclosure.
Figure 8A:
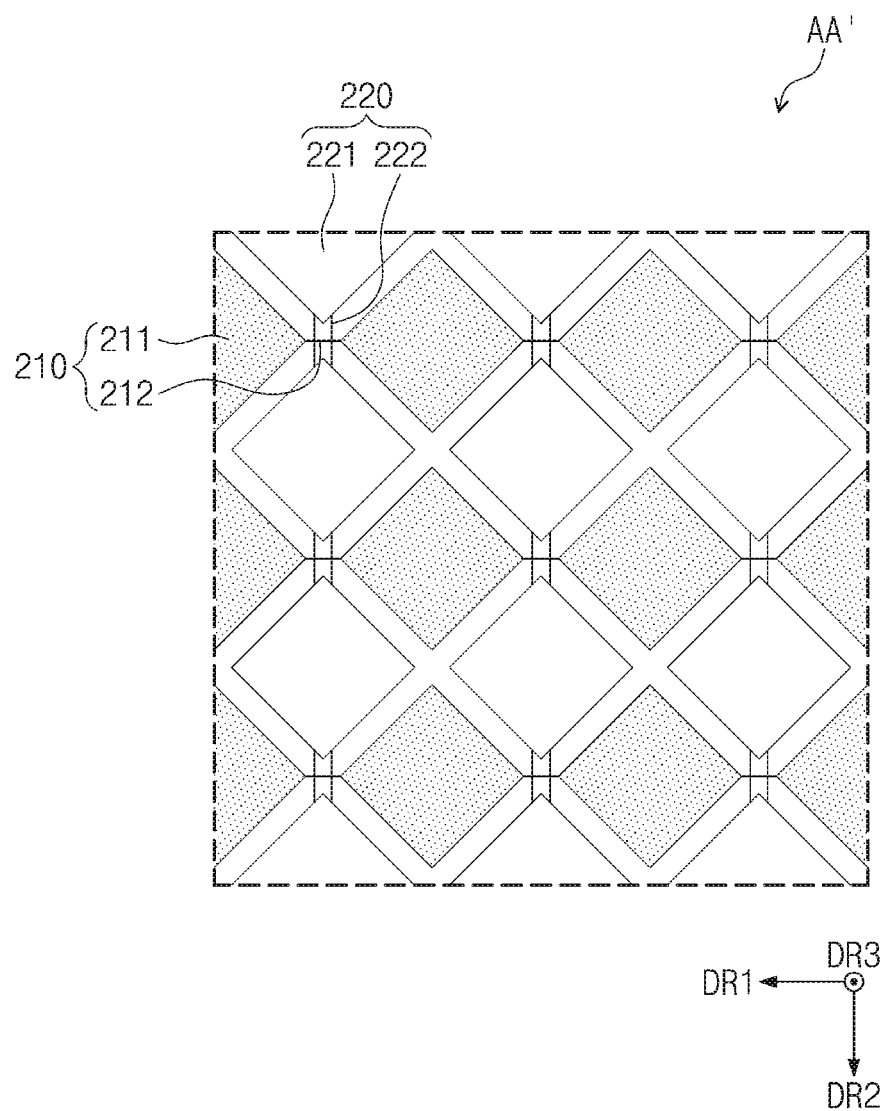
FIG. 8A is an enlarged plan view of area AA' in FIG. 7 according to an embodiment of the present disclosure.

FIG. 7 is a plan view of the sensor layer ISL according to an embodiment of the present disclosure. FIG. 8A is an enlarged plan view of area AA' in FIG. 7 according to an embodiment of the present disclosure.

Referring to FIG. 7 and FIG. 8A, a sensing area IS-A and a surrounding area IS-NA may be defined in the sensor layer ISL. The sensing area IS-A may be activated depending on an electrical signal. For example, the sensing area IS-A may sense an external input. The surrounding area IS-NA may be adjacent to the sensing area IS-A to surround the sensing area IS-A.

The sensor layer ISL may include electrodes 210, intersecting electrodes 220, first sensing lines 230, and second sensing lines 240. The electrodes 210 and the intersecting electrodes 220 may be disposed in the sensing area IS-A, and the first sensing lines 230 and the second sensing lines 240 may be disposed in the surrounding area IS-NA.

The sensor layer ISL may obtain information about an external input based on a change of mutual capacitance between the electrodes 210 and the intersecting electrodes 220. Furthermore, the sensor layer ISL may sense an input by the input device PN (refer to FIG. 3) that provides an output signal based on an electromagnetic resonance scheme.

The sensor layer ISL may include a plurality of sensing units SU. Each of the plurality of sensing units SU may correspond to an area where one of the electrodes 210 and one of the intersecting electrodes 220 intersect each other.

The electrodes 210 may extend in the first direction DR1 and may be arranged along the second direction DR2. Each of the electrodes 210 may include a first portion 211 and a second portion 212. Each of the second portions 212 may be located between and electrically connect two first portions 211 that are adjacent to each other.

The intersecting electrodes 220 may be arranged along the first direction DR1 and may extend in the second direction DR2. Each of the intersecting electrodes 220 may include an electrode pattern 221 and a connecting pattern 222 (or a bridge pattern). Each of the connecting patterns 222 may electrically connect two electrode patterns 221 that are adjacent to each other. The two electrode patterns 221 adjacent to each other may be connected with each other by two connecting patterns 222. However, the present disclosure is not limited thereto. The second portion 212 of the electrode 210 may intersect the two connecting patterns 222 of the intersecting electrode 220 in a plan view while being insulated therefrom.

The electrode patterns 221, the first portions 211, and the second portions 212 may be disposed in the same layer, and the connecting patterns 222 may be disposed in a different layer from the electrode patterns 221, the first portions 211, and the second portions 212. For example, the electrode patterns 221, the first portions 211, and the second portions 212 may be included in the second conductive layer 204 (refer to FIG. 5), and the connecting patterns 222 may be included in the first conductive layer 202 (refer to FIG. 5). This structure may be referred to as a bottom bridge structure. However, the present disclosure is not particularly limited thereto. In another example, the electrode patterns 221, the first portions 211, and the second portions 212 may be included in the first conductive layer 202 (refer to FIG. 5), and the connecting patterns 222 may be included in the second conductive layer 204 (refer to FIG. 5). This structure may be referred to as a top bridge structure.

FIG. 8A illustrates an example of the shapes and arrangement relationships of the electrodes 210 and the intersecting electrodes 220. However, the shapes and arrangement relationships of the electrodes 210 and the intersecting electrodes 220 constituting the sensor layer ISL are not limited to the example illustrated in FIG. 8A.

The first sensing lines 230 and the second sensing lines 240 may be electrically connected to corresponding pads among the pads PD.

Each of the first sensing lines 230 may be electrically connected to a corresponding one of the electrodes 210. For example, the first sensing lines 230 may be respectively connected to the right sides of the electrodes 210. However, this is merely illustrated as an example. Some of the first sensing lines 230 may be connected to the left sides of some of the electrodes 210, and the other ones of the first sensing lines 230 may be connected to the right sides of the other ones of the electrodes 210.

The second sensing lines 240 may include first intersecting sensing lines 241 and second intersecting sensing lines 242. Each of the first intersecting sensing lines 241 may be electrically connected to a corresponding one of the intersecting electrodes 220. The second intersecting sensing lines 242 may be electrically connected to the intersecting electrodes 220, respectively. For example, one first intersecting sensing line 241 and one second intersecting sensing line 242 may be electrically connected to one intersecting electrode 220. In this case, one intersecting electrode 220 may have a double routing structure as being connected to two intersecting sensing lines.

In a case where the electronic device ED (refer to FIG. 1A) is implemented as a foldable mobile phone or a tablet computer, the sensing area IS-A may be gradually increased. A difference in length between the first sensing lines 230 and a difference in length between the second sensing lines 240 may be increased as the sensing area IS-A increases. Accordingly, a resistance difference according to a touch position in the sensing area IS-A may be increased.

According to an embodiment of the present disclosure, the first shielding layer MPL (refer to FIG. 4B) disposed under the sensor layer ISL may reduce a degree of attenuation to the strength of the magnetic field TB (refer to FIG. 4A) provided by the input device PN (refer to FIG. 3). That is, the first shielding layer MPL (refer to FIG. 4B) added to the electronic device ED (refer to FIG. 1A) may compensate for signal attenuation due to a resistance difference according to a touch position by reducing attenuation of the strength of the magnetic field TB provided by the input device PN. Accordingly, despite a decrease in a current value, the current value even at a point of the greatest resistance may still be equal to or greater than a predetermined value. As a result, the first shielding layer MPL included in the display module DM may improve the sensing sensitivity of the sensor layer ISL.

A driver integrated chip (IC) T-IC may be electrically connected to the sensor layer ISL and may control operations of the sensor layer ISL. The driver IC T-IC may be mounted on the circuit film FCB. The driver IC T-IC may be electrically connected to the first sensing lines 230 and the second sensing lines 240.

According to an embodiment, the driver IC T-IC may sense not only a user's touch input but also an input by the input device PN (refer to FIG. 3) through the sensor layer ISL. That is, the driver IC T-IC may calculate not only input coordinates of the user's touch input based on a change of mutual capacitance between the electrodes 210 and the intersecting electrodes 220 but also input coordinates by the input device PN (refer to FIG. 3) that provides an output signal based on an electromagnetic resonance scheme.

Figure 8B:
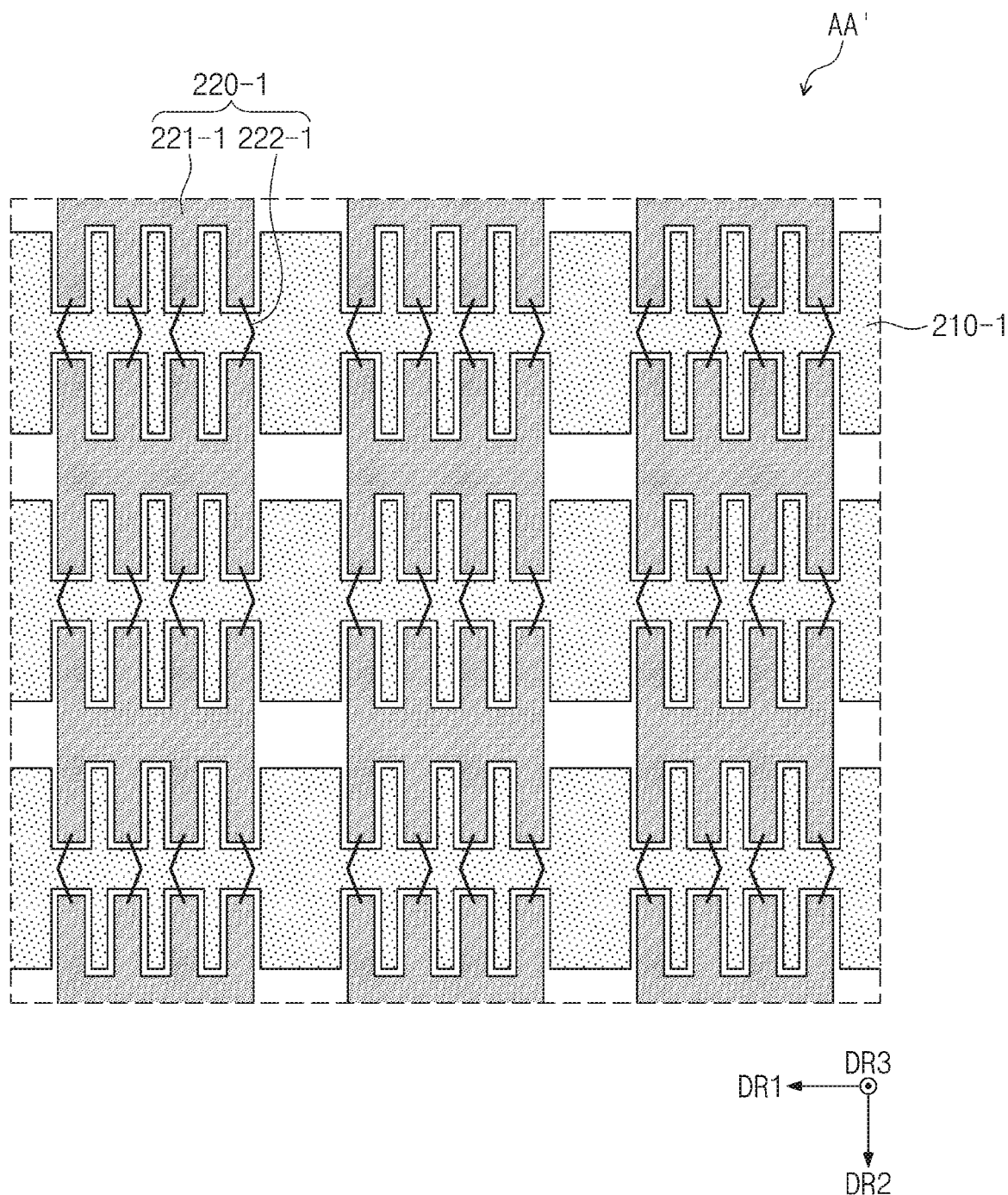
FIG. 8B is an enlarged plan view of area AA' in FIG. 7 according to another embodiment of the present disclosure.

FIG. 8B is an enlarged plan view of area AA' in FIG. 7 according to another embodiment of the present disclosure.

FIG. 8B illustrates electrodes 210-1 and intersecting electrodes 220-1 that have different shapes and connectivity from those illustrated in FIG. 8A. For example, the electrodes 210-1 and the intersecting electrodes 220-1 may have a bar shape.

The electrodes 210-1 may extend in the first direction DR1 and may be arranged along the second direction DR2.

The intersecting electrodes 220-1 may be arranged in the first direction DR1 and may extend along the second direction DR2. The intersecting electrodes 220-1 may include electrode patterns 221-1 and connecting patterns 222-1 (or bridge patterns). The connecting patterns 222-1 may electrically connect two electrode patterns 221-1 adjacent to each other. The two electrode patterns 221-1 adjacent to each other may be connected with each other by four connecting patterns 222-1. However, the present disclosure is not limited thereto. One electrode 210-1 may intersect the four connecting patterns 222-1 in a plan view while being insulated therefrom. Although FIG. 8B illustrates an example of the electrodes 210-1 and the electrode patterns 221-1 that have particular shapes and connectivity engaged with each other, the present disclosure is not limited thereto.

According to an embodiment, the electrodes 210 or 210-1 and the intersecting electrodes 220 or 220-1 described above with reference to FIGS. 8A and 8B may have a mesh structure. In this case, openings may be defined in the electrodes 210 or 210-1 and the intersecting electrodes 220 or 220-1. However, without being limited thereto, the electrodes 210 or 210-1 and the intersecting electrodes 220 or 220-1 may be transparent electrodes without any openings defined therein.

Figure 9A:
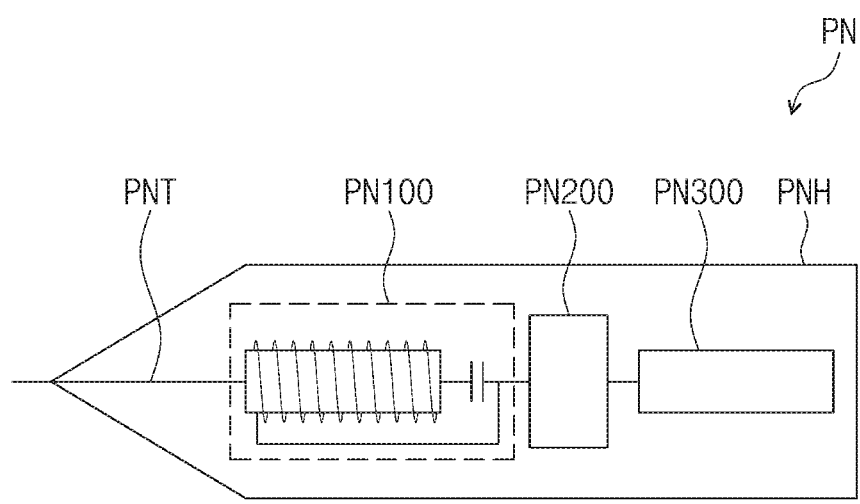
FIG. 9A is a block diagram of an input device according to an embodiment of the present disclosure.

FIG. 9A is a block diagram of the input device PN according to an embodiment of the present disclosure.

Referring to FIG. 9A, the input device PN may include a housing PNH, a pen tip PNT, a resonator PN100, a signal generator PN200, and a power supply PN300.

The housing PNH may have a pen shape and may have a space formed therein. The resonator PN100, the signal generator PN200, and the power supply PN300 may be accommodated in the space defined in the housing PNH. The pen tip PNT may be disposed in an end portion of the housing PNH. For example, a portion of the pen tip PNT may be exposed outside the housing PNH, and the remaining portion of the pen tip PNT may be placed in the housing PNH.

The resonator PN100 may include an inductor (not shown) and a capacitor (not shown). The capacitor may store energy based on a current flow by a signal (or a transmission (Tx) signal) as an electric field, and the inductor may store energy based on the current flow by the signal as a magnetic field. The inductor may include a magnetic material and a coil wound around the magnetic material.

The signal generator PN200 may generate a signal (or a detection signal, a transmission (Tx) signal). The signal generator PN200 may include an integrated circuit or an oscillator. The signal generator PN200 may output an AC signal having a predetermined frequency. For example, a signal generated by the signal generator PN200 may have a fixed frequency. For example, the signal may be a sinusoidal wave having a frequency of 560 kHz, but the present disclosure is not particularly limited thereto.

The signal generator PN200 may charge the resonator PN100 and may stop transmission of a charging signal after the resonator PN100 is charged. An induced current may be generated in the resonator PN100 by the charging signal, and the resonator PN100 may resonate by the induced current and may emit a magnetic field.

The power supply PN300 may supply power to the signal generator PN200. The power supply PN300 may include a battery or a high-capacity capacitor.

According to an embodiment of the present disclosure, the input device PN can operate in an active mode because the input device PN includes the signal generator PN200. Accordingly, the electronic device ED (refer to FIG. 3) without including a digitizer that forms a magnetic field may sense an input of the input device PN that provides an output signal based on a magnetic field.

Figure 9B:
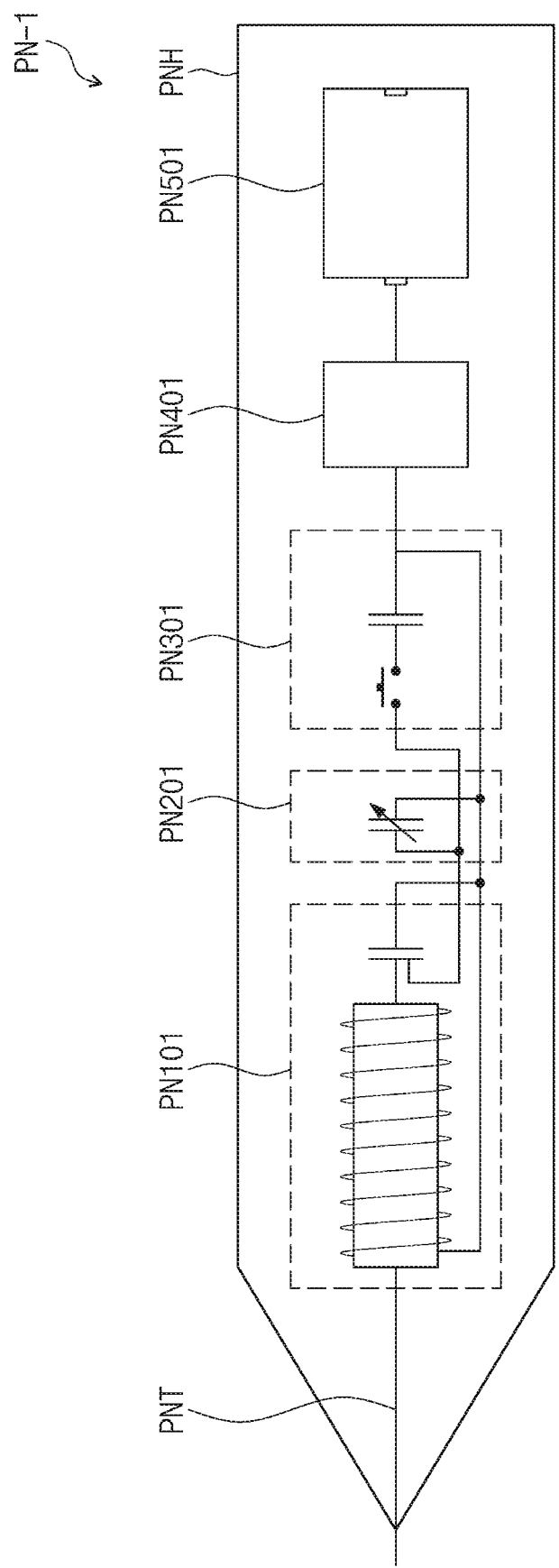
FIG. 9B is a block diagram of an input device according to another embodiment of the present disclosure.

FIG. 9B is a block diagram of an input device according to another embodiment of the present disclosure.

Referring to FIG. 9B, an input device PN-1 may include a housing PNH, a pen tip PNT, a resonator PN101, a pen pressure sensor PN201, a switch PN301, a signal generator PN401, and a power supply PN501.

The pen pressure sensor PN201 may be electrically connected to the resonator PN101 and may sense pressure applied to the pen tip PNT. For example, the pen pressure sensor PN201 may include a variable capacitor. The variable capacitor included in the pen pressure sensor PN201 may be connected in parallel to a capacitor included in the resonator PN101. The resonant frequency of a magnetic field output from the resonator PN101 when no pressure is applied may be referred to as a reference resonant frequency. When pressure is applied, a capacitance change may be generated by the variable capacitor, and the resonant frequency of a magnetic field that is output from the resonator PN101 may be varied based on the capacitance change.

The switch PN301 may include a button and at least one capacitor. The button may be manipulated by a user of the input device PN-1. The input device PN-1 may transition to various modes, for example, a pen input mode, a right click mode, and an eraser mode, in response to the user's manipulation of the switch PN301.

The signal generator PN401 may output an AC signal having a predetermined frequency. The signal generator PN401 may charge the resonator PN101 as described above with reference to FIG. 9A. Accordingly, the input device PN-1 can operate not only in a passive mode but also in an active mode because the input device PN-1 includes the signal generator PN401.

The signal generator PN401 may include an integrated circuit. In this case, the signal generator PN401 may additionally generate a signal including various pieces of information as well as an AC signal for charging the resonator PN101. For example, the signal generator PN401 may additionally output an information signal depending on a predetermined protocol. Examples of the information signal include, but are not limited to, tilt information, pressure information, and button information of the input device PN-1. The signal generator PN401 may transmit the information signal to the electronic device ED (refer to FIG. 3) in the form of a data packet.

In a case where the signal generator PN401 transmits a signal (or a downlink signal) using various types of keying schemes. Examples of the keying schemes include, but are not limited to, on-off keying (OOK), phase shift keying (PSK), differential PSK, frequency shift keying (FSK), binary PSK (BPSK), differential BPSK, or the like.

Figure 10A:
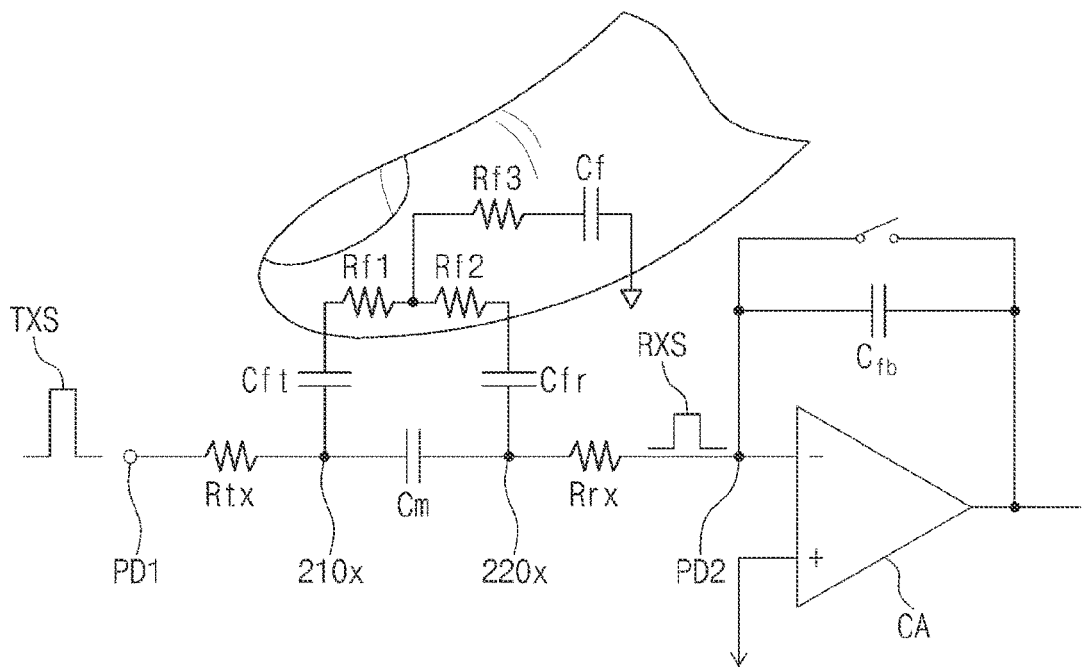
FIG. 10A is an equivalent circuit diagram illustrating an operation in a first touch mode according to an embodiment of the present disclosure.
Figure 10B:
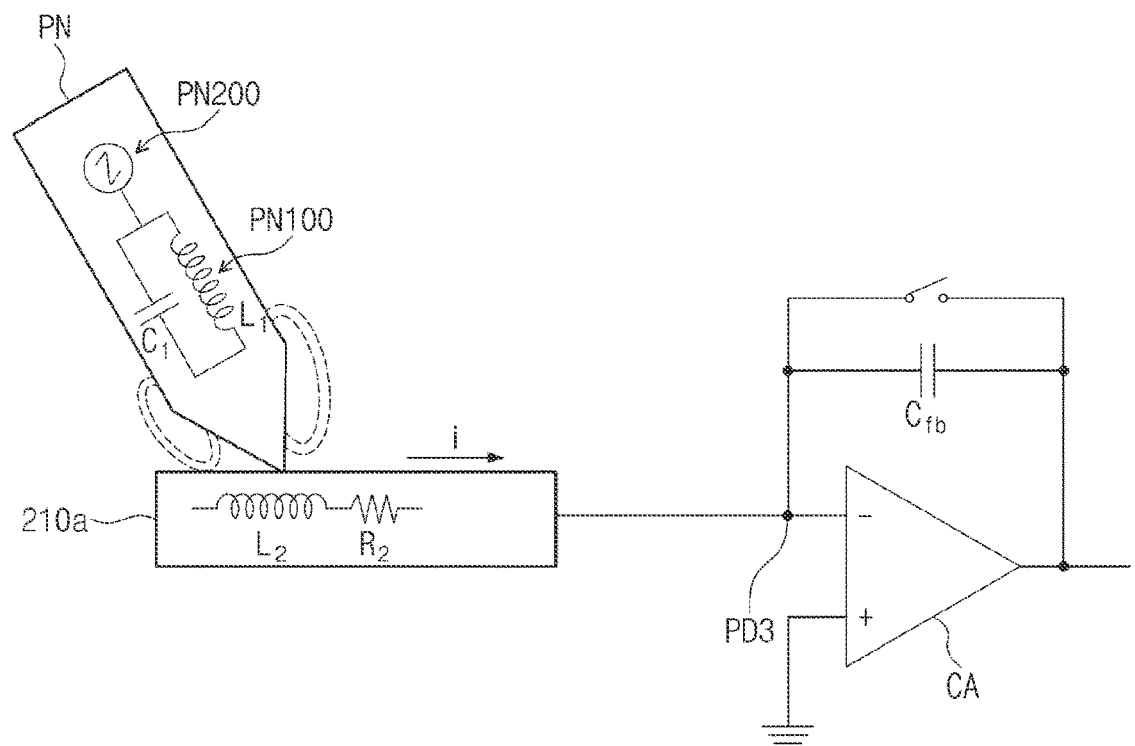
FIG. 10B is an equivalent circuit diagram illustrating an operation in a second touch mode according to an embodiment of the present disclosure.

FIG. 10A is an equivalent circuit diagram illustrating an operation in the first touch mode according to an embodiment of the present disclosure. FIG. 10B is an equivalent circuit diagram illustrating an operation in the second touch mode according to an embodiment of the present disclosure.

Referring to FIGS. 7, 10A, and 10B, the driver IC T-IC and the sensor layer ISL may operate in the first touch mode for sensing a user's touch or in the second touch mode for sensing an input by the input device PN (refer to FIG. 3).

The driver IC T-IC may control the sensor layer ISL to selectively and/or alternately operate the sensor layer ISL in the first touch mode or the second touch mode. Alternatively, while operating in the first touch mode, the driver IC T-IC may transition to the second touch mode based on a predetermined signal provided by the input device PN. The operating modes of the sensor layer ISL controlled by the driver IC T-IC are not particularly limited to the above-described examples.

The driver IC T-IC may include a charge amplifier CA. The charge amplifier CA may receive an electrical signal that varies depending on a touch of the user or an input by the input device PN and may output a touch signal accordingly.

Referring to FIG. 10A, in the first touch mode, the driver IC T-IC may transmit a detection signal TXS to the electrodes 210 and may receive a sensed signal RXS from the intersecting electrodes 220. When a touch event occurs, mutual capacitance Cm between an electrode 210x and an intersecting electrode 220x at a point corresponding to the touch event may be changed. The touch event may cause a change in the capacitance (hereinafter referred to as touch capacitance) between opposite terminals of the mutual capacitance Cm. The touch capacitance may include two capacitances Cft and Cfr that are connected in series.

The capacitance Cft may be formed between the electrode 210x, to which the detection signal TXS is applied, and an input means (e.g., a finger), and the capacitance Cfr may be formed between the intersecting electrode 220x and the input means.

The driver IC T-IC may read the sensed signal RXS from the intersecting electrode 220x and may measure, from the sensed signal RXS, a capacitance change ΔCm depending on the input of the input means. The driver IC T-IC may measure the capacitance change ΔCm by sensing a current change caused by the input of the input means.

FIG. 10A also illustrates equivalent resistances Rf1, Rf2, and Rf3 formed by the input means, capacitance Cf between the input means and the ground, equivalent resistance Rtx between a pad PD1 to which the detection signal TXS is applied and the point of the electrode 210x where the touch event occurs, and equivalent resistance Rrx between a pad PD2 from which the sensed signal RXS is output and the point of the intersecting electrode 220x where the touch event occurs.

Referring to FIG. 10B, in the second touch mode, the driver IC T-IC may receive a sensed signal (note it is different from the sensed signal RXS shown in FIG. 10A) caused by the input device PN from at least one of the electrodes 210 or the intersecting electrodes 220. FIG. 10B illustrates an example in which an input of the input device PN is sensed through the electrodes 210. However, the present disclosure is not particularly limited thereto.

An inverting input of the charge amplifier CA may be electrically connected to an electrode 210a. Reference voltage potential may be provided to a non-inverting input of the charge amplifier CA. A capacitor $C_{fb}$ may be connected between the inverting input of the charge amplifier CA and an output of the charge amplifier CA.

When the input device PN approaches, an induced current i may flow in the electrode 210a due to a magnetic field that is output from the input device PN. The resonator PN100 of the input device PN may include an inductor L1 and a capacitor C1. An inductor $L_2$ may represent parasitic inductance generated in the electrode 210a. A resistor $R_2$ may correspond to a resistance between the point of the electrode 210a where a touch event occurs and a pad PD3 from which the induced current i is output. The charge amplifier CA may receive the induced current i and may output a voltage signal based on the induced current i and the capacitor $C_{fb}$.

The magnitude of the resistor $R_2$ may vary depending on the position of an input by the input device PN. According to the embodiment of the present disclosure, the first shielding layer MPL (refer to FIG. 4B) disposed under the sensor layer ISL may reduce a degree of attenuation to the strength of the magnetic field TB (refer to FIG. 4A) provided by the input device PN. Accordingly, despite a decrease in the induced current i by the magnetic field input even at a point where the resistor $R_2$ is greatest, the strength of the induced current i may be equal to or greater than a predetermined value. That is, the first shielding layer MPL (refer to FIG. 4B) added to the electronic device ED (refer to FIG. 1A) may compensate for signal attenuation due to a resistance difference according to a touch position, by reducing attenuation of the strength of the magnetic field TB provided by the input device PN. As a result, the sensing sensitivity of the sensor layer ISL may be improved.

Figure 11:
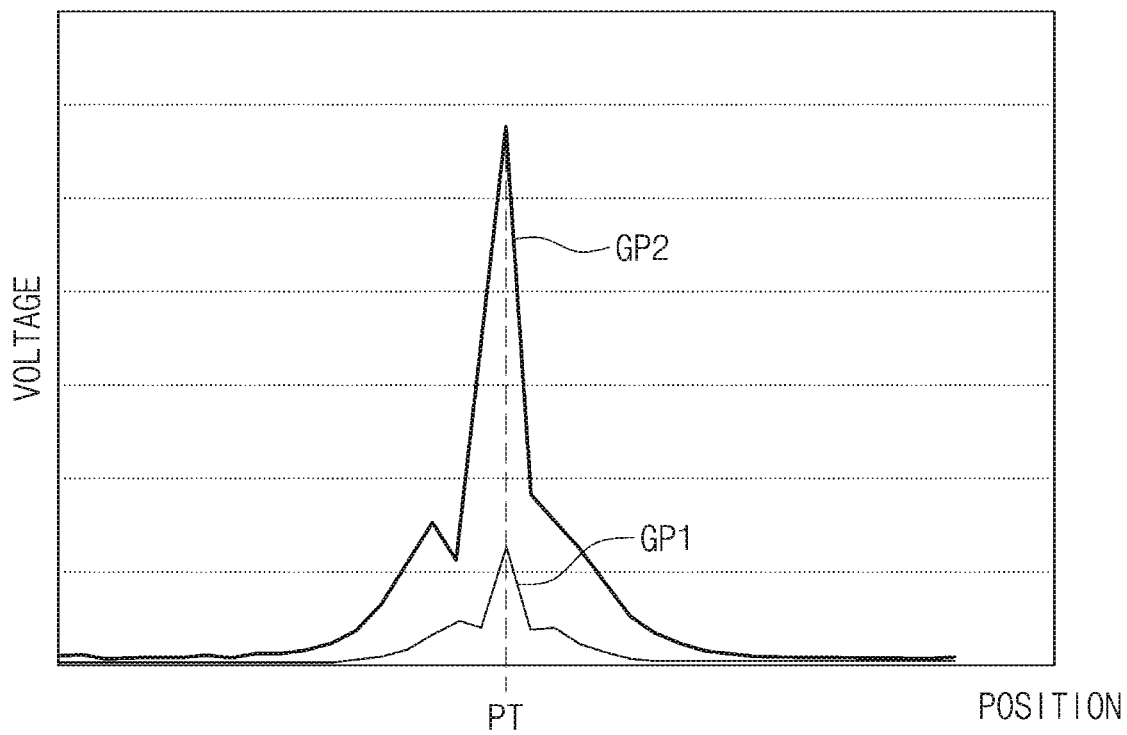
FIG. 11 illustrates graphs depicting input device signals measured depending on a presence or absence of a first shielding layer.

FIG. 11 illustrates graphs depicting input device signals measured depending on a presence or absence of the first shielding layer MPL.

Referring to FIG. 11, a first graph GP1 shows a voltage value according to a comparative example of the present disclosure, and a second graph GP2 shows a voltage value according to an embodiment of the present disclosure. For example, in the first graph GP1 and the second graph GP2, the voltage values may have peak values at a center point PT, and the center point PT may correspond to a position of an input point by the input device PN (refer to FIG. 3).

The first graph GP1 shows a voltage value measured through the electrode 210 (refer to FIG. 8A) or the intersecting electrode 220 (refer to FIG. 8A) in a case where the first shielding layer MPL (refer to FIG. 4A) is not provided, and the second graph GP2 shows a voltage value measured through the electrode 210 (refer to FIG. 8A) or the intersecting electrode 220 (refer to FIG. 8A) in a case where the first shielding layer MPL (refer to FIG. 4A) is provided.

According to the embodiment of the present disclosure, the first shielding layer MPL (refer to FIG. 4A) may provide a magnetic path for the magnetic field TB that is output from the input device PN (refer to FIG. 4A) and transmits through the sensor layer ISL (refer to FIG. 4A). In this case, the first shielding layer MPL may prevent or reduce an eddy current caused by a change of the magnetic field TB. As a result, the first shielding layer MPL may reduce a degree of attenuation to the strength of a signal provided by the input device PN.

Accordingly, the first shielding layer MPL (refer to FIG. 4A) added to the electronic device ED (refer to FIG. 1A) may compensate for signal attenuation due to a resistance difference according to a touch position, by reducing attenuation of the strength of the magnetic field TB provided by the input device PN.

Figure 12:
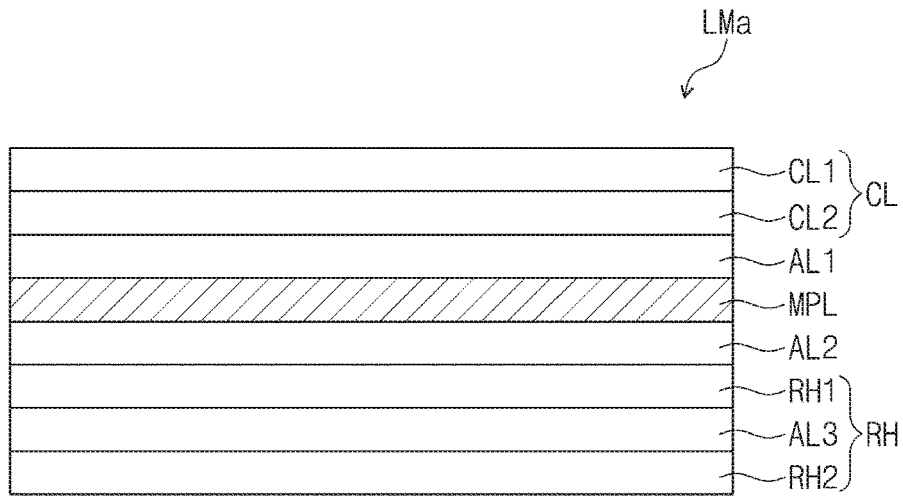
FIG. 12 is a sectional view illustrating a lower member according to an embodiment of the present disclosure.
Figure 12:
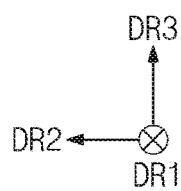

FIG. 12 is a sectional view illustrating a lower member according to an embodiment of the present disclosure.

Referring to FIG. 12, a lower member LMa may include a first lower member CL, a second lower member RH, and a first shielding layer MPL. The first lower member CL may be disposed under the display layer DPL (refer to FIG. 4A). The second lower member RH may be disposed under the first lower member CL.

The first shielding layer MPL may be disposed between the first lower member CL and the second lower member RH.

The first lower member CL may be referred to as a protective member or a compensation member, and the second lower member RH may be referred to as a heat dissipation member.

The first shielding layer MPL may be attached to the first lower member CL by a first adhesive layer AL1. The first shielding layer MPL may be attached to the second lower member RH by a second adhesive layer AL2. The first shielding layer MPL may include a base layer coated with magnetic metal powder. Alternatively, the first shielding layer MPL may include a layer in which magnetic metal powder is dispersed.

The first lower member CL may include a first lower layer CL1 disposed under the display layer DPL (refer to FIG. 4A) and a second lower layer CL2 disposed under the first lower layer CL1. The first lower layer CL1 and the second lower layer CL2 may directly contact with each other, or an adhesive layer may be disposed between the first lower layer CL1 and the second lower layer CL2.

The first lower layer CL1 may be an embossing layer including an uneven surface. For example, the first lower layer CL1 may include a colored layer. The first lower layer CL1 may absorb light incident on the first lower layer CL1.

The second lower layer CL2 may be a cushion layer. The second lower layer CL2 may include an elastomer such as a sponge, an expanded foam, or a urethane resin. Alternatively, the second lower layer CL2 may contain at least one of an acrylate-based polymer, a urethane-based polymer, a silicone-based polymer, or an imide-based polymer, but is not limited thereto.

The second lower member RH may include a third lower layer RH1 and a fourth lower layer RH2 attached to the bottom surface of the third lower layer RH1. A third adhesive layer AL3 may be disposed between the third lower layer RH1 and the fourth lower layer RH2.

The third lower layer RH1 and the fourth lower layer RH2 may have a high thermal conductivity. For example, the third lower layer RH1 may contain graphite, and the fourth lower layer RH2 may contain copper or a copper alloy.

The first adhesive layer AL1, the second adhesive layer AL2, and the third adhesive layer AL3 may be pressure sensitive adhesive layers or optically clear adhesive members, but are not particularly limited thereto. In an embodiment of the present disclosure, the first adhesive layer AL1, the second adhesive layer AL2, and the third adhesive layer AL3 may have the substantially similar adhesive force, or may have different adhesive forces. For example, the adhesive force of the first adhesive layer AL1 may be greater than the adhesive forces of the second adhesive layer AL2 and the third adhesive layer AL3.

The position of the first shielding layer MPL is not limited to the example of the lower member LMa illustrated in FIG. 12. For example, the first shielding layer MPL may be disposed on an upper surface of the first lower layer CL1 or a lower surface of the fourth lower layer RH2, or may be disposed between a lower surface of the first lower layer CL1 and an upper surface of the second lower layer CL2 or between a lower surface of the third lower layer RH1 and an upper surface of the fourth lower layer RH2.

Figure 13:
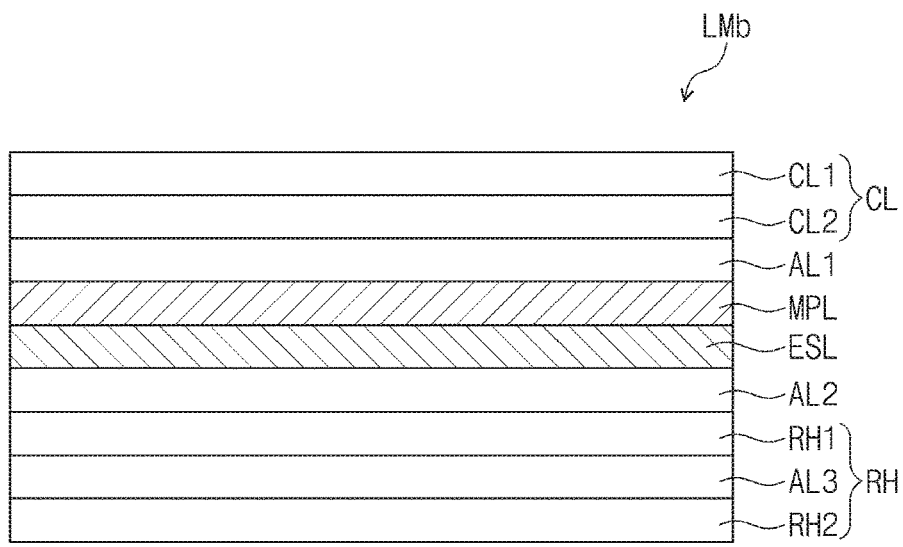
FIG. 13 is a sectional view illustrating a lower member according to another embodiment of the present disclosure.
Figure 13:
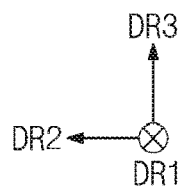

FIG. 13 is a sectional view illustrating a lower member according to another embodiment of the present disclosure.

Referring to FIG. 13, a lower member LMb may include a first lower member CL, a second lower member RH, a first shielding layer MPL, and a second shielding layer ESL.

The second shielding layer ESL may be disposed under the first shielding layer MPL. The second shielding layer ESL may be spaced apart from the sensor layer ISL (refer to FIG. 4B) with the first shielding layer MPL disposed therebetween. The second shielding layer ESL may shield an electromagnetic field or noise emanating from a module disposed under the second shielding layer ESL. Furthermore, the second shielding layer ESL may prevent a magnetic field (e.g., the magnetic field TB; refer to FIG. 4A) passing through the first shielding layer MPL from being transferred to a layer under the second shielding layer ESL. The second shielding layer ESL may be formed of aluminum, magnesium, a magnesium alloy, stainless steel, copper, or a copper alloy, but is not particularly limited thereto.

The second shielding layer ESL may directly contact the first shielding layer MPL. In this case, a separate layer, for example, an adhesive layer, may not be disposed between the second shielding layer ESL and the first shielding layer MPL.

The positions of the first shielding layer MPL and the second shielding layer ESL are not limited to the example of the lower member LMb illustrated in FIG. 13. For example, the first shielding layer MPL and the second shielding layer ESL may be disposed on an upper surface of a first lower layer CL1 or a lower surface of a fourth lower layer RH2, or may be disposed between a lower surface of the first lower layer CL1 and an upper surface of a second lower layer CL2 or between a lower surface of a third lower layer RH1 and an upper surface of the fourth lower layer RH2.

Figure 14:
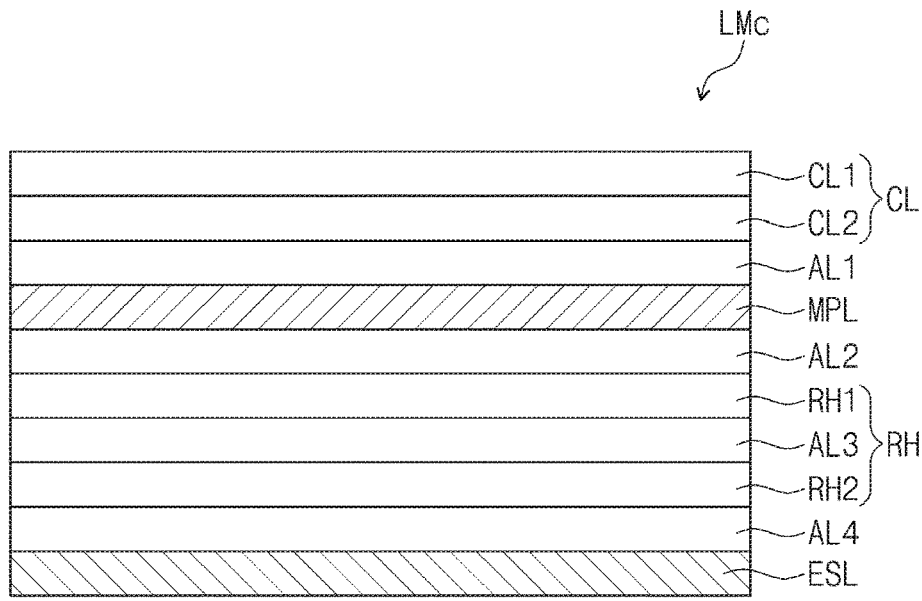
FIG. 14 is a sectional view illustrating a lower member according to another embodiment of the present disclosure.
Figure 14:
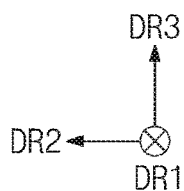

FIG. 14 is a sectional view illustrating a lower member according to another embodiment of the present disclosure.

Referring to FIG. 14, a lower member LMc may include a first lower member CL, a second lower member RH, a first shielding layer MPL, and a second shielding layer ESL. The second shielding layer ESL may be spaced apart from the first shielding layer MPL. For example, other layers of the lower member LMc may be disposed between the second shielding layer ESL and the first shielding layer MPL.

In the example of FIG. 14, the first shielding layer MPL may be disposed between the first lower member CL and the second lower member RH, and the second shielding layer ESL may be attached to a lower surface of the second lower member RH by a fourth adhesive layer AL4. A second adhesive layer AL2, the second lower member RH, and the fourth adhesive layer AL4 may be disposed between the first shielding layer MPL and the second shielding layer ESL. In an embodiment of the present disclosure, the second shielding layer ESL may be directly disposed on the lower surface of a fourth lower layer RH2 without the fourth adhesive layer AL4.

Figure 15:
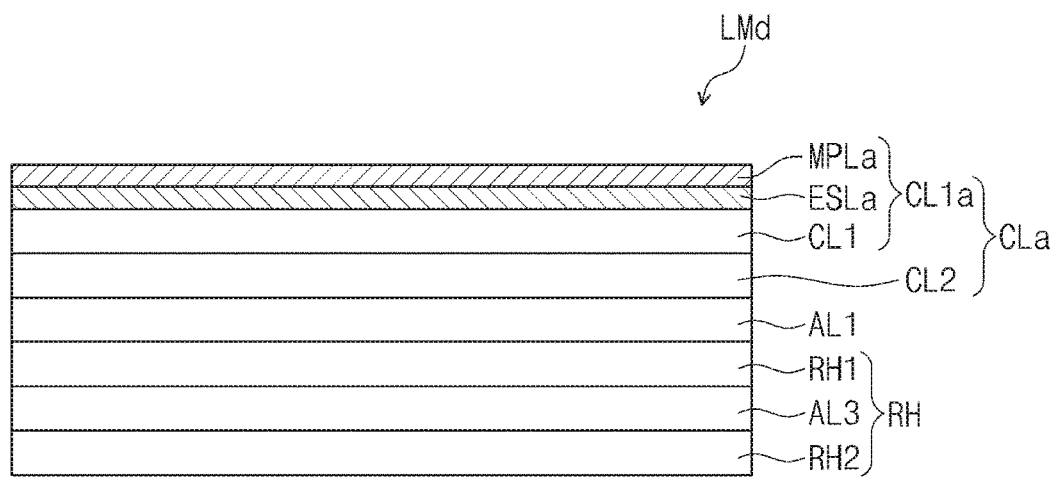
FIG. 15 is a sectional view illustrating a lower member according to another embodiment of the present disclosure.
Figure 15:
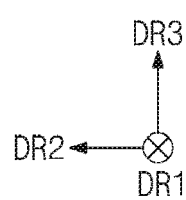

FIG. 15 is a sectional view illustrating a lower member according to another embodiment of the present disclosure.

Referring to FIG. 15, a lower member LMd may include a first lower member CLa and a second lower member RH. The first lower member CLa and the second lower member RH may be attached to each other by a first adhesive layer AL1.

The first lower member CLa may include a first lower stacked layer CL1a and a second lower layer CL2. The first lower stacked layer CL1a may include a first lower layer CL1, a second shielding layer ESLa, and a first shielding layer MPLa. The second shielding layer ESLa may be directly formed on the first lower layer CL1, and the first shielding layer MPLa may be directly formed on the second shielding layer ESLa. In this case, an adhesive layer for attaching the first shielding layer MPLa and the second shielding layer ESLa may be omitted. The omission of an adhesive layer may reduce the thickness of the lower member LMd and improve the flexibility of the lower member LMd.

In FIG. 15, both the first shielding layer MPLa and the second shielding layer ESLa are illustrated as being disposed on an upper surface of the first lower layer CL1. However, the present disclosure is not limited thereto. In an embodiment, the first shielding layer MPLa and the second shielding layer ESLa may be sequentially disposed on a lower surface of the first lower layer CL1. In another embodiment, the first shielding layer MPLa may be disposed on the upper surface of the first lower layer CL1, and the second shielding layer ESLa may be disposed on the lower surface of the first lower layer CL1. In yet another embodiment, the second shielding layer ESLa may be omitted. In this case, the first shielding layer MPLa may be directly disposed on the upper or lower surface of the first lower layer CL1.

Figure 16:
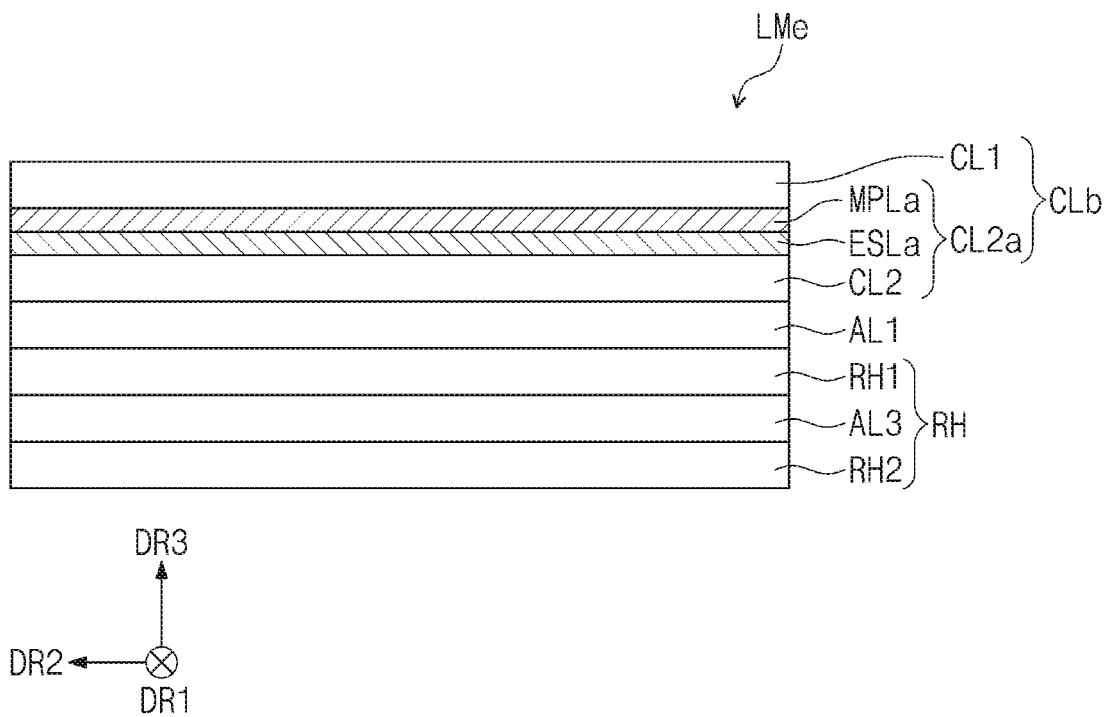
FIG. 16 is a sectional view illustrating a lower member according to another embodiment of the present disclosure.

FIG. 16 is a sectional view illustrating a lower member according to another embodiment of the present disclosure.

Referring to FIG. 16, a lower member LMe may include a first lower member CLb and a second lower member RH. The first lower member CLb may include a first lower layer CL1 and a second lower stacked layer CL2a.

The second lower stacked layer CL2a may include a second lower layer CL2, a second shielding layer ESLa, and a first shielding layer MPLa. The second shielding layer ESLa may be directly formed on the second lower layer CL2, and the first shielding layer MPLa may be directly formed on the second shielding layer ESLa. However, the stacked structure of the second lower stacked layer CL2a is not limited to the example illustrated in FIG. 16. In one embodiment, the first shielding layer MPLa may be disposed on an upper surface of the second lower layer CL2, and the second shielding layer ESLa may be disposed on a lower surface of the second lower layer CL2. In another embodiment, the first shielding layer MPLa and the second shielding layer ESLa may be sequentially disposed under the second lower layer CL2. In yet another embodiment, the second shielding layer ESLa may be omitted.

Figure 17:
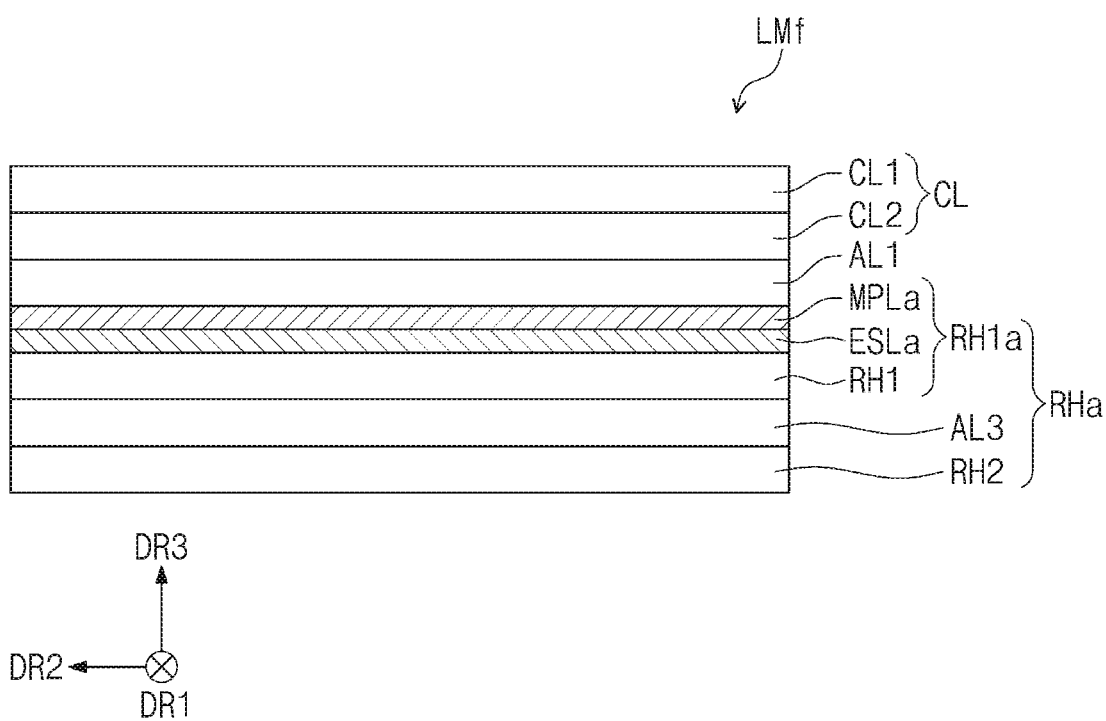
FIG. 17 is a sectional view illustrating a lower member according to another embodiment of the present disclosure.

FIG. 17 is a sectional view illustrating a lower member according to another embodiment of the present disclosure.

Referring to FIG. 17, a lower member LMf may include a first lower member CL and a second lower member RHa. The second lower member RHa may include a third lower stacked layer RH1a and a fourth lower layer RH2.

The third lower stacked layer RH1a may include a third lower layer RH1, a second shielding layer ESLa directly disposed on an upper surface of the third lower layer RH1, and a first shielding layer MPLa directly disposed on an upper surface of the second shielding layer ESLa. However, the stacked structure of the third lower stacked layer RH1a is not limited to the example illustrated in FIG. 17. In one embodiment, the first shielding layer MPLa may be disposed on the upper surface of the third lower layer RH1, and the second shielding layer ESLa may be disposed on a lower surface of the third lower layer RH1. In another embodiment, the first shielding layer MPLa and the second shielding layer ESLa may be sequentially disposed under the third lower layer RH1. In yet another embodiment, the second shielding layer ESLa may be omitted.

Figure 18:
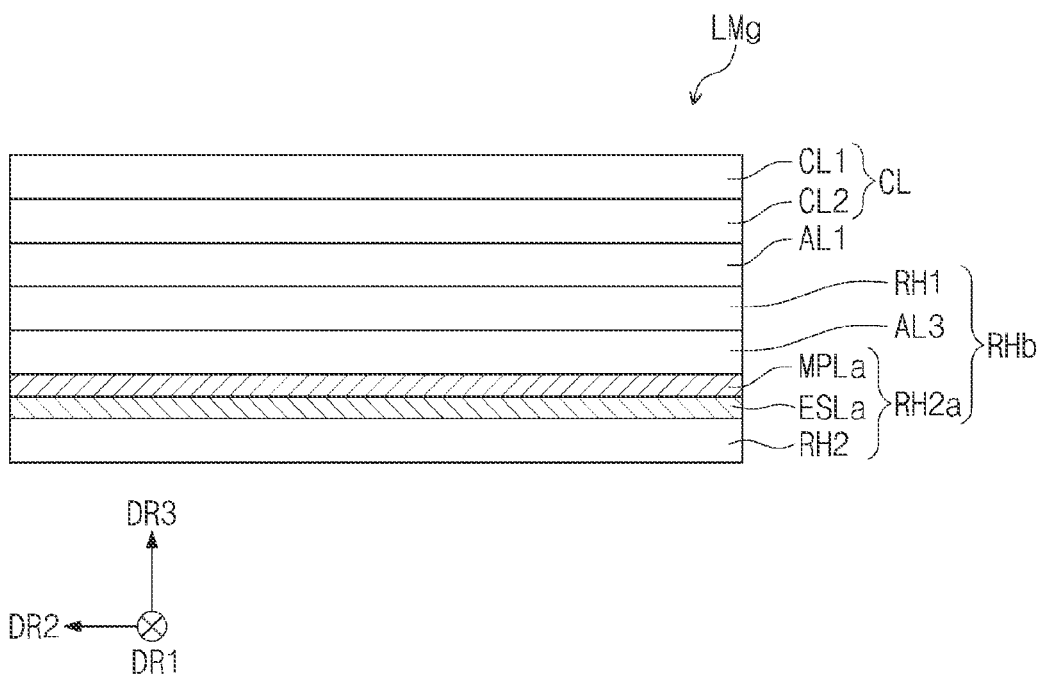
FIG. 18 is a sectional view illustrating a lower member according to another embodiment of the present disclosure.

FIG. 18 is a sectional view illustrating a lower member according to another embodiment of the present disclosure.

Referring to FIG. 18, a lower member LMg may include a first lower member CL and a second lower member RHb. The second lower member RHb may include a third lower layer RH1 and a fourth lower stacked layer RH2a.

The fourth lower stacked layer RH2a may include a fourth lower layer RH2, a second shielding layer ESLa directly disposed on an upper surface of the fourth lower layer RH2, and a first shielding layer MPLa directly disposed on an upper surface of the second shielding layer ESLa. However, the stacked structure of the third lower stacked layer RH1a is not limited to the example illustrated in FIG. 18. In one embodiment, the first shielding layer MPLa may be disposed on the upper surface of the fourth lower layer RH2, and the second shielding layer ESLa may be disposed on a lower surface of the fourth lower layer RH2. In another embodiment, the first shielding layer MPLa and the second shielding layer ESLa may be sequentially disposed under the fourth lower layer RH2. In yet another embodiment, the second shielding layer ESLa may be omitted.

Figure 19:
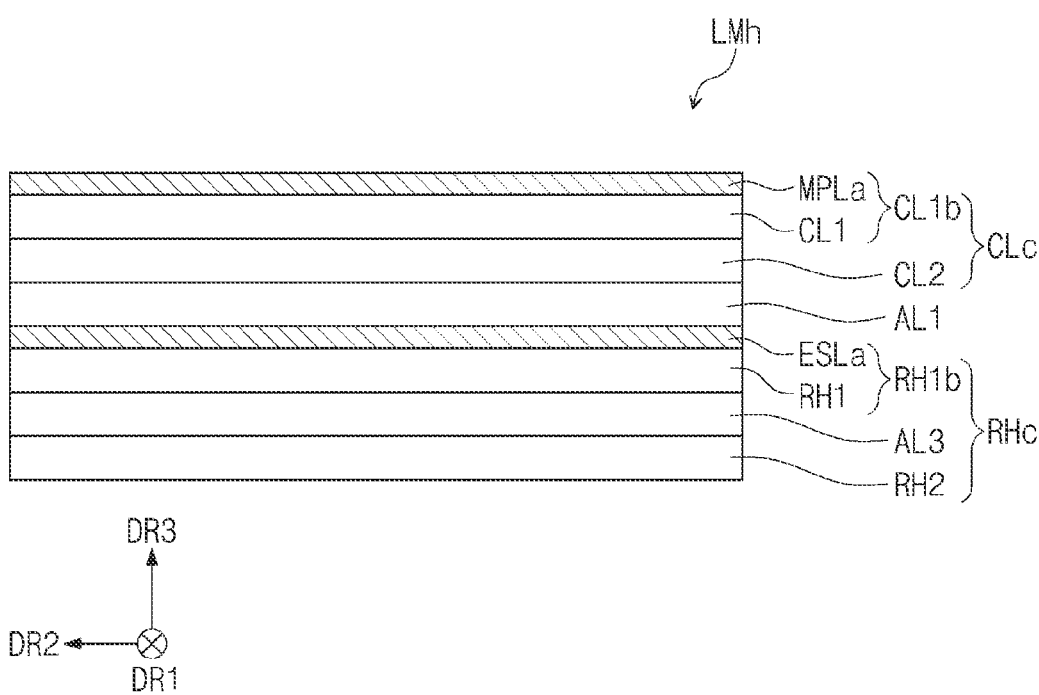
FIG. 19 is a sectional view illustrating a lower member according to another embodiment of the present disclosure.

FIG. 19 is a sectional view illustrating a lower member according to another embodiment of the present disclosure.

Referring to FIG. 19, a lower member LMh may include a first lower member CLc and a second lower member RHc. The first lower member CLc may include a first lower stacked layer CL1b and a second lower layer CL2. The second lower member RHc may include a third lower stacked layer RH1b and a fourth lower layer RH2.

The first lower stacked layer CL1b may include a first lower layer CL1 and a first shielding layer MPLa directly disposed on an upper surface of the first lower layer CL1. The third lower stacked layer RH1b may include a third lower layer RH1 and a second shielding layer ESLa directly disposed on an upper surface of the third lower layer RH1. The first shielding layer MPLa and the second shielding layer ESLa may be formed in different layers. In a case where the first shielding layer MPLa is disposed closer to the sensor layer ISL (refer to FIG. 4C) than the second shielding layer ESLa, the positions of the first shielding layer MPLa and the second shielding layer ESLa may be variously modified without being limited to the example illustrated in FIG. 19.

Figure 20:
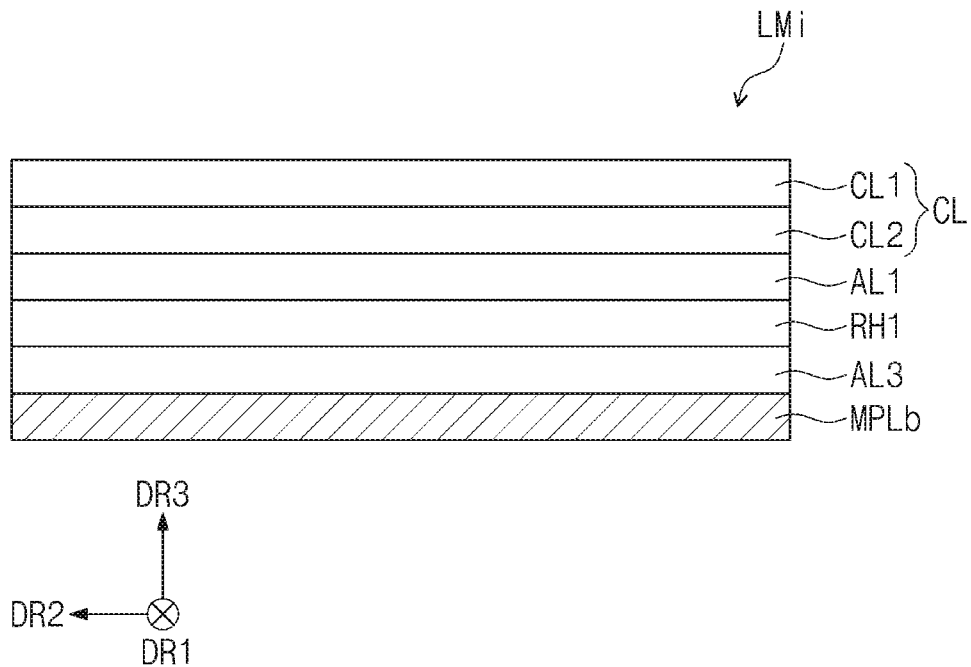
FIG. 20 is a sectional view illustrating a lower member according to another embodiment of the present disclosure.

FIG. 20 is a sectional view illustrating a lower member according to another embodiment of the present disclosure.

Referring to FIG. 20, a lower member LMi may include a first lower member CL that includes a first lower layer CL1 and a second lower layer CL2, a third lower layer RH1, and a first shielding layer MPLb. The first shielding layer MPLb may be attached to the bottom of the third lower layer RH1 by a third adhesive layer AL3. In this case, the above-described fourth lower layer RH2 (refer to FIG. 13) may be omitted.

The first shielding layer MPLb may contain a material having a higher resistance and a higher magnetic permeability than a material contained in the fourth lower layer RH2 (refer to FIG. 13). For example, the fourth lower layer RH2 (refer to FIG. 13) may contain copper, and the first shielding layer MPLb may contain a material having a higher resistance and a higher magnetic permeability than copper. For example, the first shielding layer MPLb may include a magnetic iron plate. The first shielding layer MPLb may contain permalloy, an iron-carbon-based alloy, or an amorphous alloy.

Although not illustrated, a second shielding layer ESL or ESLa may be additionally disposed on a lower surface of the first shielding layer MPLb. In this case, the second shielding layer ESL or ESLa may be directly disposed on the first shielding layer MPLb, or may be attached to the first shielding layer MPLb by an adhesive layer.

Figure 21:
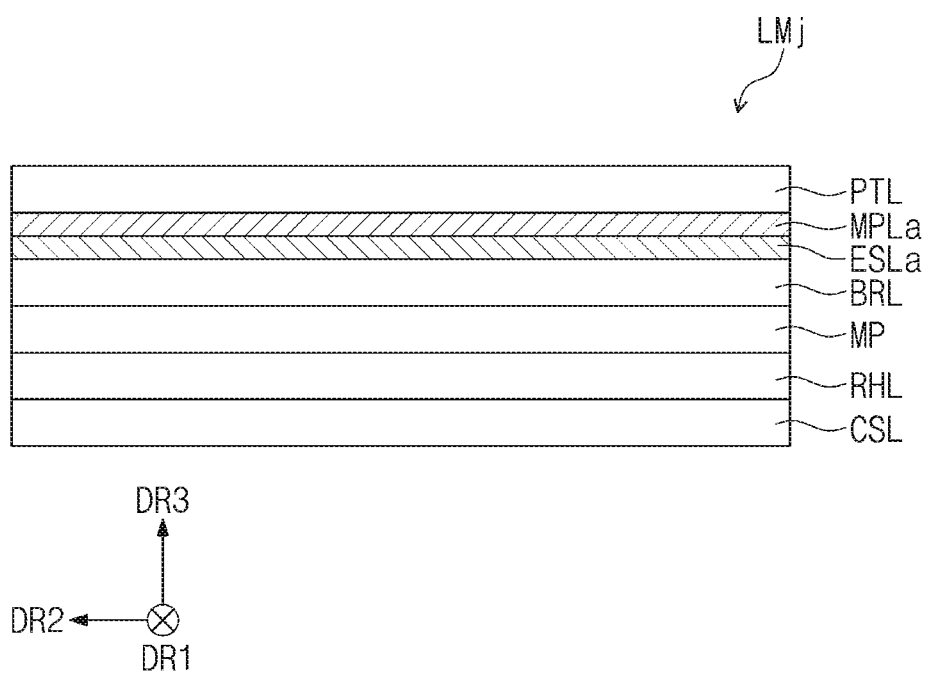
FIG. 21 is a sectional view illustrating a lower member according to another embodiment of the present disclosure.

FIG. 21 is a sectional view illustrating a lower member according to another embodiment of the present disclosure.

Referring to FIG. 21, a lower member LMj includes a first shielding layer MPLa and a second shielding layer ESLa, and may have various stacked structures. The lower member LMj illustrated in FIG. 21 may have a stacked structure including various layers that is different from the structures of the lower members LMa through LMi described with reference to FIGS. 12 through 20. For example, the lower member LMj may include a protective layer PTL, the first shielding layer MPLa, the second shielding layer ESLa, a barrier layer BRL, a support layer MP, a heat dissipation layer RHL, and a cushion layer CSL.

The protective layer PTL may prevent scratches on a rear surface of the display panel DP (refer to FIG. 2) during a manufacturing process of the display panel DP (refer to FIG. 2). The protective layer PTL may include a colored polyimide layer. For example, the protective layer PTL may be, but is not limited to, an opaque yellow layer.

The barrier layer BRL may increase resistance to a compressive force that may be caused by external pressing. Accordingly, the barrier layer BRL may serve to prevent deformation of the display panel DP (refer to FIG. 2). The barrier layer BRL may contain a flexible plastic material such as polyimide or polyethylene terephthalate. Furthermore, the barrier layer BRL may absorb light incident from the outside. The barrier layer BRL may contain a light-blocking material, or may include a colored layer having a low light transmittance. For example, the barrier layer BRL may be a black plastic layer, for example, a black polyimide film.

The support layer MP may be disposed under the barrier layer BRL. The support layer MP may support components disposed on the support layer MP and may maintain the electronic device ED (refer to FIG. 1A) in a flat or folded state. An opening may be defined in a portion of the support layer MP that overlaps the folding area FA (refer to FIG. 1A).

The heat dissipation layer RHL may be attached to the bottom of the support layer MP, and the cushion layer CSL may be attached to the bottom of the heat dissipation layer RHL.

In an embodiment of the present disclosure, the first shielding layer MPLa and the second shielding layer ESLa may be disposed between the protective layer PTL and the barrier layer BRL. However, the present disclosure is not particularly limited thereto. The first shielding layer MPLa and the second shielding layer ESLa may be directly disposed on at least one of layers included in the lower member LMj. In a case where the first shielding layer MPLa and the second shielding layer ESLa are described as directly disposed on a layer, it may mean that the first shielding layer MPLa and the second shielding layer ESLa are directly coupled to the layer without an adhesive. In this case, an adhesive layer for attaching the first shielding layer MPLa and the second shielding layer ESLa may be omitted. Accordingly, the thickness of the lower member LMj may be decreased, and the flexibility of the lower member LMj may be improved.

As the sensing area of the electronic device ED (refer to FIGS. 1A and 1B) increases, a resistance difference according to a touch position in the sensing area may be increased. The electronic device ED according to an embodiment of the present disclosure may include the first shielding layer MPL providing a magnetic path for a magnetic field that is emitted from the input device PN and transmits through the sensor layer ISL. In this case, the first shielding layer MPL may reduce or remove destructive interference due to an eddy current that may be caused by a residual magnetic field. That is, the first shielding layer MPL added to the electronic device ED may compensate for signal attenuation due to a resistance difference according to a touch position, by reducing attenuation of the strength of the magnetic field provided by the input device PN. Accordingly, despite a decrease of a current value by a magnetic field input at a point where resistance is greatest, the current value may be equal to or greater than a predetermined value. As a result, the sensing sensitivity of the sensor layer ISL may be improved.

While the present disclosure has been described with reference to some embodiments, it will be apparent to those of ordinary skill in the art that various changes and modifications may be made thereto without departing from the spirit and scope of the present disclosure including the following claims.

What is claimed is:
1. An electronic device comprising:
   a display layer;
   a sensor layer disposed on the display layer; and
   a lower member disposed under the display layer, the lower member including a first shielding layer,
   wherein the sensor layer operates in a first touch mode for sensing a first input based on a capacitance change and a second touch mode for sensing a second input of an input device that is configured to emit a magnetic field, and
   wherein the first shielding layer shields the magnetic field that is transmitted through the sensor layer.
2. The electronic device of claim 1, wherein the lower member further includes:
   a first lower member disposed under the display layer; and
   a second lower member disposed under the first lower member, and
   wherein the first shielding layer is disposed between the first lower member and the second lower member.
3. The electronic device of claim 2, wherein the lower member further includes a second shielding layer spaced apart from the sensor layer with the first shielding layer interposed therebetween.
4. The electronic device of claim 3, wherein the first shielding layer directly contacts the second shielding layer.
5. The electronic device of claim 3, wherein the first shielding layer and the second shielding layer are spaced apart from each other, and at least a portion of the first lower member or the second lower member included in the lower member is disposed between the first shielding layer and the second shielding layer.
6. The electronic device of claim 1, wherein the lower member further includes:
   a first lower member including a first lower layer disposed under the display layer and a second lower layer disposed under the first lower layer; and
   a second lower member including a third lower layer disposed under the first lower member and a fourth lower layer disposed under the third lower layer.
7. The electronic device of claim 6, wherein the first shielding layer is directly disposed on a first surface of at least one of the first lower layer, the second lower layer, the third lower layer, or the fourth lower layer.
8. The electronic device of claim 7, wherein the lower member further includes a second shielding layer spaced apart from the sensor layer with the first shielding layer interposed therebetween, and
   wherein the second shielding layer is directly disposed on a second surface of at least one of the first shielding layer, the first lower layer, the second lower layer, the third lower layer, or the fourth lower layer.
9. The electronic device of claim 6, wherein the second lower layer comprises a shock-absorbing material, and at least one of the third lower layer and the fourth lower layer comprises a heat-dissipating material.
10. The electronic device of claim 1, wherein the lower member further includes a first lower layer disposed under the display layer and a second lower layer disposed under the first lower layer, and wherein the first shielding layer is disposed under the second lower layer.

11. The electronic device of claim 10, wherein the first shielding layer comprises a material having a resistance and a magnetic permeability higher than copper.

12. The electronic device of claim 1, further comprising:
a driver integrated chip (IC) electrically connected to the sensor layer and configured to control an operation of the sensor layer,
wherein the sensor layer includes a plurality of electrodes and a plurality of intersecting electrodes,
wherein, in the first touch mode, the driver IC calculates a first input coordinate by a user's touch, based on a change of mutual capacitance between the plurality of electrodes and the plurality of intersecting electrodes, and
wherein, in the second touch mode, the driver IC calculates a second input coordinate by the input device using the plurality of electrodes or the plurality of intersecting electrodes.

13. The electronic device of claim 1, wherein foldable areas are respectively defined in the display layer and the sensor layer, and each of the foldable areas of the display layer and the sensor layer is foldable to have a predetermined curvature.

14. An interface system comprising:
an input device configured to emit a magnetic field; and
an electronic device including a display layer, a sensor layer disposed on the display layer, and a first shielding layer that is disposed under the display layer and configured to shield the magnetic field transmitted through the sensor layer,
wherein the sensor layer operates in a first touch mode for sensing a first input based on a capacitance change and a second touch mode for sensing a second input of the input device.

15. The interface system of claim 14, wherein the input device includes a signal generator configured to generate a signal, a power supply configured to supply power to the signal generator, and a resonator that generates the magnetic field according to the signal.

16. The interface system of claim 14, wherein the electronic device further includes a first lower layer disposed under the display layer and a second lower layer disposed under the first lower layer, and
wherein the first shielding layer is attached to at least one of the first lower layer or the second lower layer or directly contact one of the first lower layer or the second lower layer.

17. The interface system of claim 14, wherein the electronic device further includes a second shielding layer spaced apart from the sensor layer with the first shielding layer interposed therebetween.

18. The interface system of claim 17, wherein the first shielding layer directly contacts the second shielding layer.

19. The interface system of claim 17, wherein the first shielding layer and the second shielding layer are spaced apart from each other, and at least one layer is disposed between the first shielding layer and the second shielding layer.

20. The interface system of claim 14, wherein the electronic device further includes a driver integrated chip (IC) configured to control an operation of the sensor layer,
wherein the sensor layer includes a plurality of electrodes and a plurality of intersecting electrodes,
wherein, in the first touch mode, the driver IC calculates a first input coordinate by a user's touch, based on a change of mutual capacitance between the plurality of electrodes and the plurality of intersecting electrodes, and
wherein, in the second touch mode, the driver IC calculates a second input coordinate by the input device using the plurality of electrodes or the plurality of intersecting electrodes.

* * * * *